(12) United States Patent
Roh et al.

(10) Patent No.: US 12,062,335 B2
(45) Date of Patent: Aug. 13, 2024

(54) DISPLAY DEVICE

(71) Applicant: Samsung Display Co., Ltd., Yongin-si (KR)

(72) Inventors: Jinyoung Roh, Yongin-si (KR);
Hae-Kwan Seo, Yongin-si (KR);
Bon-Seog Gu, Yongin-si (KR);
Jaekeun Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/323,370

(22) Filed: May 24, 2023

(65) Prior Publication Data

US 2024/0046873 A1    Feb. 8, 2024

(30) Foreign Application Priority Data

Aug. 2, 2022   (KR) .................. 10-2022-0095980

(51) Int. Cl.
*G09G 3/36*     (2006.01)
*G09G 3/3233*   (2016.01)
*H10K 59/121*   (2023.01)

(52) U.S. Cl.
CPC ....... *G09G 3/3233* (2013.01); *H10K 59/1213* (2023.02); *G09G 2300/0413* (2013.01); *G09G 2300/0819* (2013.01); *G09G 2300/0842* (2013.01); *G09G 2300/0861* (2013.01)

(58) Field of Classification Search
CPC ......... G09G 3/3233; G09G 2300/0452; G09G 2310/0262; G09G 3/3607; G09G 2300/0426; H10K 59/88
See application file for complete search history.

(56) References Cited

U.S. PATENT DOCUMENTS

| | | | |
|---|---|---|---|
| 10,964,272 B2 | 3/2021 | Park et al. | |
| 2015/0130787 A1 | 5/2015 | Chung | |
| 2017/0337874 A1 | 11/2017 | Toyomura et al. | |
| 2018/0075797 A1* | 3/2018 | Park | G09G 3/03 |
| 2022/0115462 A1 | 4/2022 | Jung et al. | |
| 2022/0406854 A1* | 12/2022 | Choi | G09G 3/3266 |
| 2023/0122018 A1* | 4/2023 | Choi | G09G 3/20 |
| | | | 345/690 |
| 2023/0157102 A1 | 5/2023 | Du et al. | |

FOREIGN PATENT DOCUMENTS

KR   10-2019-0118696 A   10/2019
WO   WO 2022/111116 A1    6/2022

* cited by examiner

*Primary Examiner* — Dennis P Joseph
(74) *Attorney, Agent, or Firm* — Lewis Roca Rothgerber Christie LLP

(57) ABSTRACT

A display device includes: a first light emitting element; a third light emitting element adjacent to the first light emitting element in a first direction; second light emitting elements respectively adjacent to the first and third light emitting elements in a second direction crossing the first direction; first pixel circuits respectively under the first and third light emitting elements; second pixel circuits respectively under the second light emitting elements; and a dummy pixel circuit in a dummy circuit area adjacent to a display area in which the first, second, and third light emitting elements and the first and second pixel circuits are arranged and connected to the third light emitting element, wherein the dummy pixel circuit has a width smaller than a width of each of the first pixel circuits in the second direction.

20 Claims, 22 Drawing Sheets

DISPLAY DEVICE

CROSS-REFERENCE TO RELATED APPLICATION

This application claims priority to and the benefit of Korean Patent Application No. 10-2022-0095980, filed on Aug. 2, 2022, the contents of which are hereby incorporated by reference in its entirety.

BACKGROUND

1. Field

Aspects of some embodiments of the present disclosure relate to a display device.

2. Description of the Related Art

Electronic devices that display images to a user, such as a smart phone, a digital camera, a notebook computer, a navigation unit, and a smart television, include a display device to display the images. The display device generates the images and displays the images to the user through a display screen thereof.

The display device includes pixels generating the images and a driver driving the pixels. Each pixel includes a light emitting element, a plurality of transistors connected to the light emitting element, and at least one capacitor connected to the transistors. The transistors and the capacitor are driven by the driver to allow the light emitting element to emit a light.

A circuit design to place the transistors is defined as a layout. Layouts are being developed to place the transistors in various ways. Development of a technology to reduce the arrangement area of the transistors may be desirable.

The above information disclosed in this Background section is only for enhancement of understanding of the background and therefore the information discussed in this Background section does not necessarily constitute prior art.

SUMMARY

Aspects of some embodiments of the present disclosure include a display device capable of reducing an area of a dummy pixel circuit in a dummy circuit area.

According to some embodiments of the inventive concept a display device includes: a first light emitting element, a third light emitting element adjacent to the first light emitting element in a first direction, second light emitting elements respectively adjacent to the first and third light emitting elements in a second direction crossing the first direction, first pixel circuits respectively under the first and third light emitting elements, second pixel circuits respectively under the second light emitting elements, and a dummy pixel circuit in a dummy circuit area adjacent to a display area in which the first, second, and third light emitting elements and the first and second pixel circuits are arranged and connected to the third light emitting element. According to some embodiments, the dummy pixel circuit has a width smaller than a width of each of the first pixel circuits in the second direction.

According to some embodiments of the inventive concept, a display device includes: a first light emitting element, a third light emitting element adjacent to the first light emitting element in a first direction, second light emitting elements respectively adjacent to the first and third light emitting elements in a second direction crossing the first direction, first pixel circuits respectively under the first and third light emitting elements, second pixel circuits respectively under the second light emitting elements, and a dummy pixel circuit in a dummy circuit area adjacent to a display area in which the first, second, and third light emitting elements and the first and second pixel circuits are arranged and connected to the third light emitting element. According to some embodiments, the dummy pixel circuit has an area smaller than a sum of areas of the first pixel circuits.

According to some embodiments of the inventive concept, a display device includes: a first light emitting element, a third light emitting element adjacent to the first light emitting element in a first direction, a second light emitting element adjacent to the first light emitting element in a second direction crossing the first direction, a first pixel circuit under the first light emitting element and connected to the first light emitting element, a second pixel circuit under the second light emitting element and connected to the second light emitting element, and a dummy pixel circuit in a dummy circuit area adjacent to a display area in which the first, second, and third light emitting elements and the first and second pixel circuits are arranged and connected to the third light emitting element. According to some embodiments, the first pixel circuit includes a first transistor driving the first light emitting element, the dummy pixel circuit includes a first-first transistor driving the third light emitting element, a source area, a channel area, and a drain area of the first transistor are arranged in the second direction, and a source area, a channel area, and a drain area of the first-first transistor are arranged in the first direction.

According to some embodiments of the present disclosure, the width of the dummy pixel circuit in the dummy circuit area may be smaller than that of the pixel circuit in the display area. As the area of the dummy pixel circuit is reduced, the size of the dummy circuit area may decrease.

BRIEF DESCRIPTION OF THE DRAWINGS

The above and other aspects of some embodiments of the present disclosure will become readily apparent by reference to the following detailed description when considered in conjunction with the accompanying drawings wherein.

DETAILED DESCRIPTION

Figure 1:
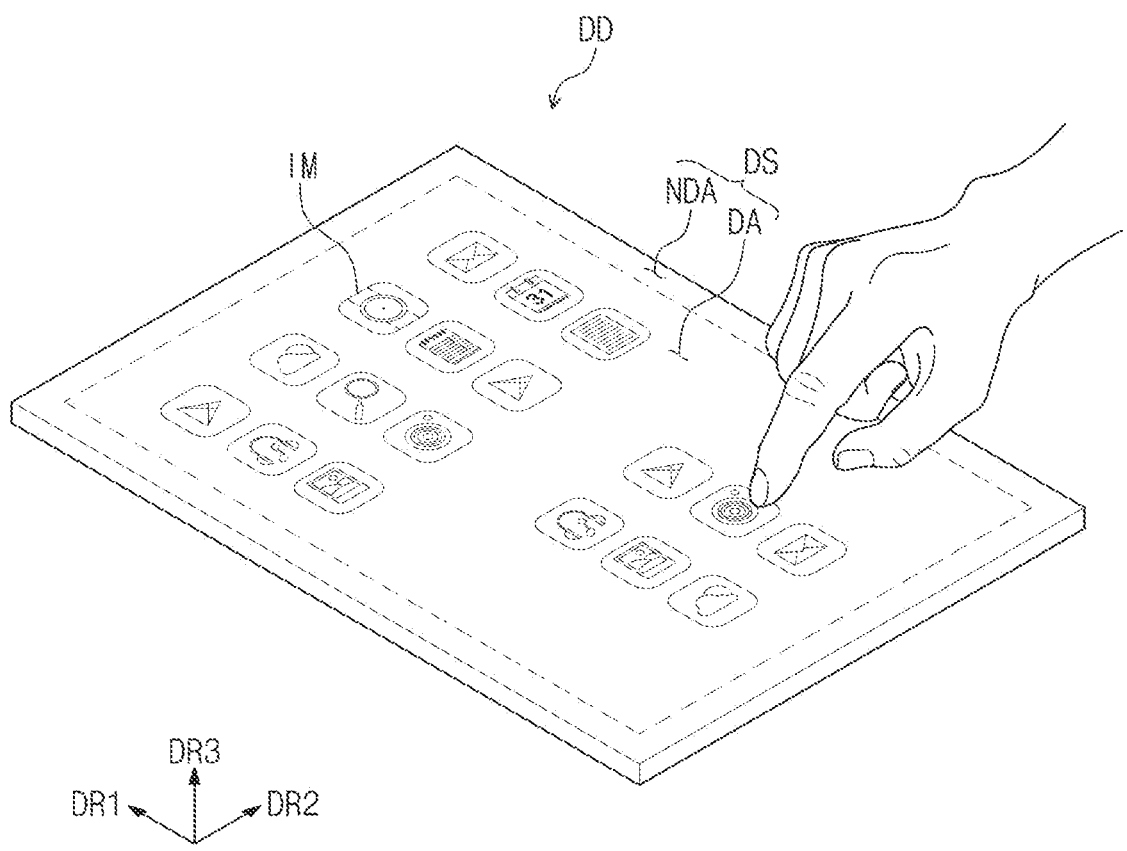
FIG. 1 is a perspective view of a display device according to some embodiments of the present disclosure.

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content.

As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, aspects of some embodiments of the present disclosure will be described with reference to accompanying drawings.

FIG. 1 is a perspective view of a display device DD according to some embodiments of the present disclosure.

Referring to FIG. 1, the display device DD may have a rectangular shape defined by long sides extending in a first direction DR1 and short sides extending in a second direction DR2 crossing the first direction DR1. However, the shape of the display device DD should not be limited to the rectangular shape, and the display device DD may have various shapes, such as a circular shape and a polygonal shape.

Hereinafter, a direction substantially perpendicular to a plane defined by the first direction DR1 and the second direction DR2 may be referred to as a third direction DR3. In the present disclosure, the expression "when viewed in a plane" or "in a plan view" may mean a state of being viewed in the third direction DR3.

An upper surface of the display device DD may be referred to as a display surface DS and may be a plane surface defined by the first direction DR1 and the second direction DR2. Images IM generated by the display device DD may be provided to a user through the display surface DS.

The display surface DS may include a display area DA and a non-display area NDA around the display area DA. The display area DA may display the images IM, and the non-display area NDA may not display the images IM. The non-display area NDA may surround the display area DA and may define an edge of the display device DD, which is printed with a predetermined color.

The display device DD may be applied to a large-sized electronic item, such as a television set, a monitor, or an outdoor billboard, and a small and medium-sized electronic item, such as a personal computer, a notebook computer, a personal digital assistant, a car navigation unit, a game unit, a smartphone, a tablet computer, or a camera. However, these are merely examples, and the display device DD may be applied to other electronic devices as long as they do not depart from the concept of the present disclosure.

Figure 2:
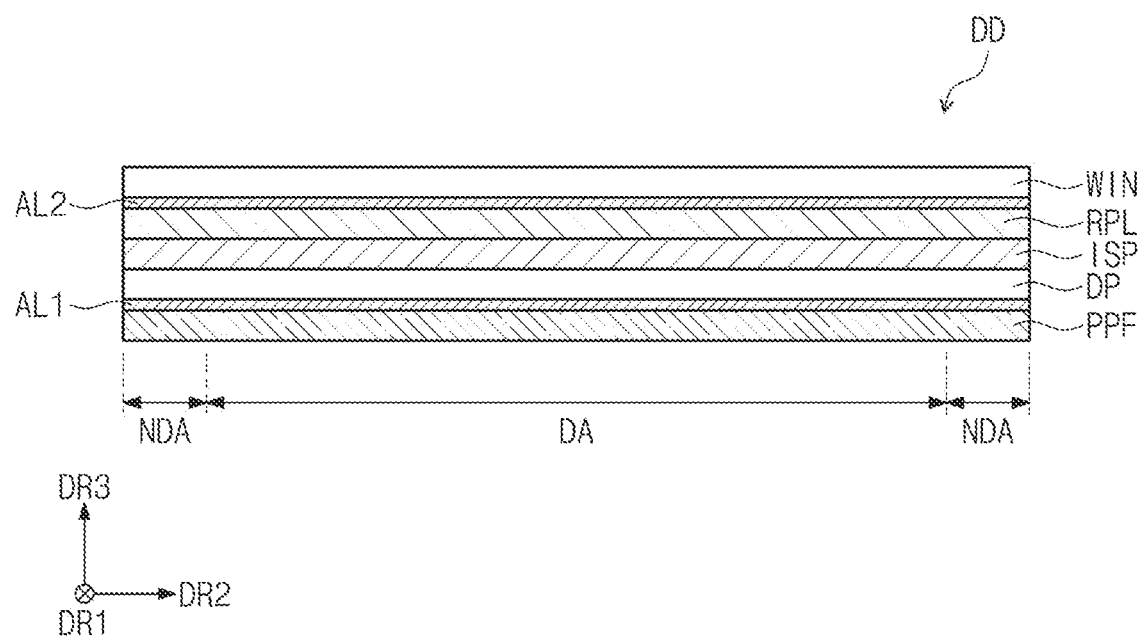
FIG. 2 is a cross-sectional view of the display device shown in FIG. 1 according to some embodiments of the present disclosure.

FIG. 2 is a cross-sectional view of the display device DD shown in FIG. 1.

As an example, FIG. 2 shows a cross-section of the display device DD when viewed in the first direction DR1.

Referring to FIG. 2, the display device DD may include a display panel DP, an input sensing unit ISP, an anti-reflective layer RPL, a window WIN, a panel protective film PPF, and first and second adhesive layers AL1 and AL2.

The display panel DP may be a flexible display panel. The display panel DP may be a light-emitting type display panel, however, it should not be particularly limited. For instance, the display panel DP may be an organic light emitting display panel or an inorganic light emitting display panel. A light emitting layer of the organic light emitting display panel may include an organic light emitting material. A light emitting layer of the inorganic light emitting display panel may include a quantum dot or a quantum rod. Hereinafter, the organic light emitting display panel will be described as a representative example of the display panel DP.

The input sensing unit ISP may be located on the display panel DP. The input sensing unit ISP may include a plurality of sensing portions to sense an external input by a capacitive method. The input sensing unit ISP may be manufactured directly on the display panel DP when the display device DD is manufactured, however, it should not be limited thereto or thereby. According to some embodiments, the input sensing unit ISP may be attached to the display panel DP by an adhesive layer after being manufactured separately from the display panel DP.

The anti-reflective layer RPL may be located on the input sensing unit ISP. The anti-reflective layer RPL may be manufactured directly on the input sensing unit ISP when the display device DD is manufactured, however, the present disclosure should not be limited thereto or thereby. According to some embodiments, the anti-reflective layer RPL may be attached to the input sensing unit ISP by an adhesive layer after being manufactured as a separate panel.

The anti-reflective layer RPL may be defined as an external light reflection preventing film. The anti-reflective layer RPL may reduce a reflectance with respect to an external light incident to the display panel DP from the above of the display device DD. The external light may not be perceived by the user by the anti-reflective layer RPL.

In a case where the external light traveling to the display panel DP is provided to the user after being reflected by the display panel DP, like a mirror, the user may perceive the external light. The anti-reflective layer RPL may include color filters that display the same colors as those of pixels of the display panel DP to prevent or reduce the above-mentioned phenomenon.

The color filters may filter the external light such that the external light may have the same color as the pixels. In this case, the external light may not be perceived by the user. However, the present disclosure should not be limited thereto or thereby, and the anti-reflective layer RPL may include a retarder and/or a polarizer to reduce the reflectance with respect to the external light.

The window WIN may be located on the anti-reflective layer RPL. The window WIN may protect the display panel DP, the input sensing unit ISP, and the anti-reflective layer RPL from external scratches and impacts.

The panel protective film PPF may be located under the display panel DP. The panel protective film PPF may protect a lower portion of the display panel DP. The panel protective film PPF may include a flexible plastic material such as polyethylene terephthalate (PET).

The first adhesive layer AL1 may be located between the display panel DP and the panel protective film PPF. The display panel DP and the panel protective film PPF may be coupled to each other by the first adhesive layer AL1. The second adhesive layer AL2 may be located between the window WIN and the anti-reflective layer RPL, and the window WIN and the anti-reflective layer RPL may be coupled to each other by the second adhesive layer AL2.

Figure 3:
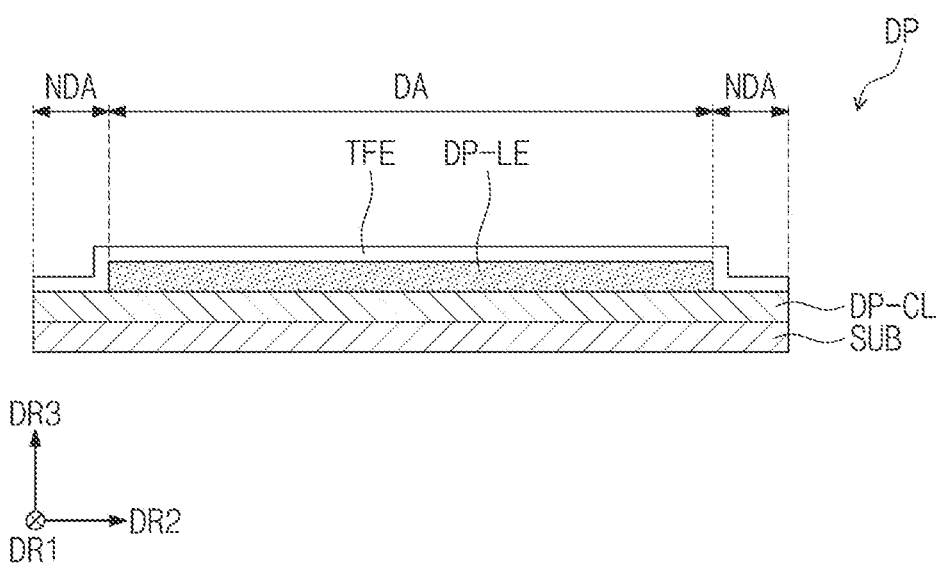
FIG. 3 is a cross-sectional view of a display panel shown in FIG. 2 according to some embodiments of the present disclosure.

FIG. 3 is a cross-sectional view of the display panel DP shown in FIG. 2.

As an example, FIG. 3 shows a cross-section of the display panel DP when viewed in the first direction DR1.

Referring to FIG. 3, the display panel DP may include a substrate SUB, a circuit element layer DP-CL located on the substrate SUB, a display element layer DP-LE located on the circuit element layer DP-CL, and a thin film encapsulation layer TFE located on the display element layer DP-LE.

The substrate SUB may include the display area DA and the non-display area NDA around the display area DA. The substrate SUB may include a glass material or a flexible plastic material such as polyimide (PI). The display element layer DP_LE may be located in the display area DA.

A plurality of pixels may be located in the circuit element layer DP-CL and the display element layer DP-LE. Each pixel may include transistors located in the circuit element layer DP-CL and a light emitting element located in the display element layer DP-LE and connected to the transistors.

The thin film encapsulation layer TFE may be located on the circuit element layer DP-CL to cover the display element layer DP-LE. The thin film encapsulation layer TFE may protect the pixels from moisture, oxygen, and a foreign substance.

Figure 4:
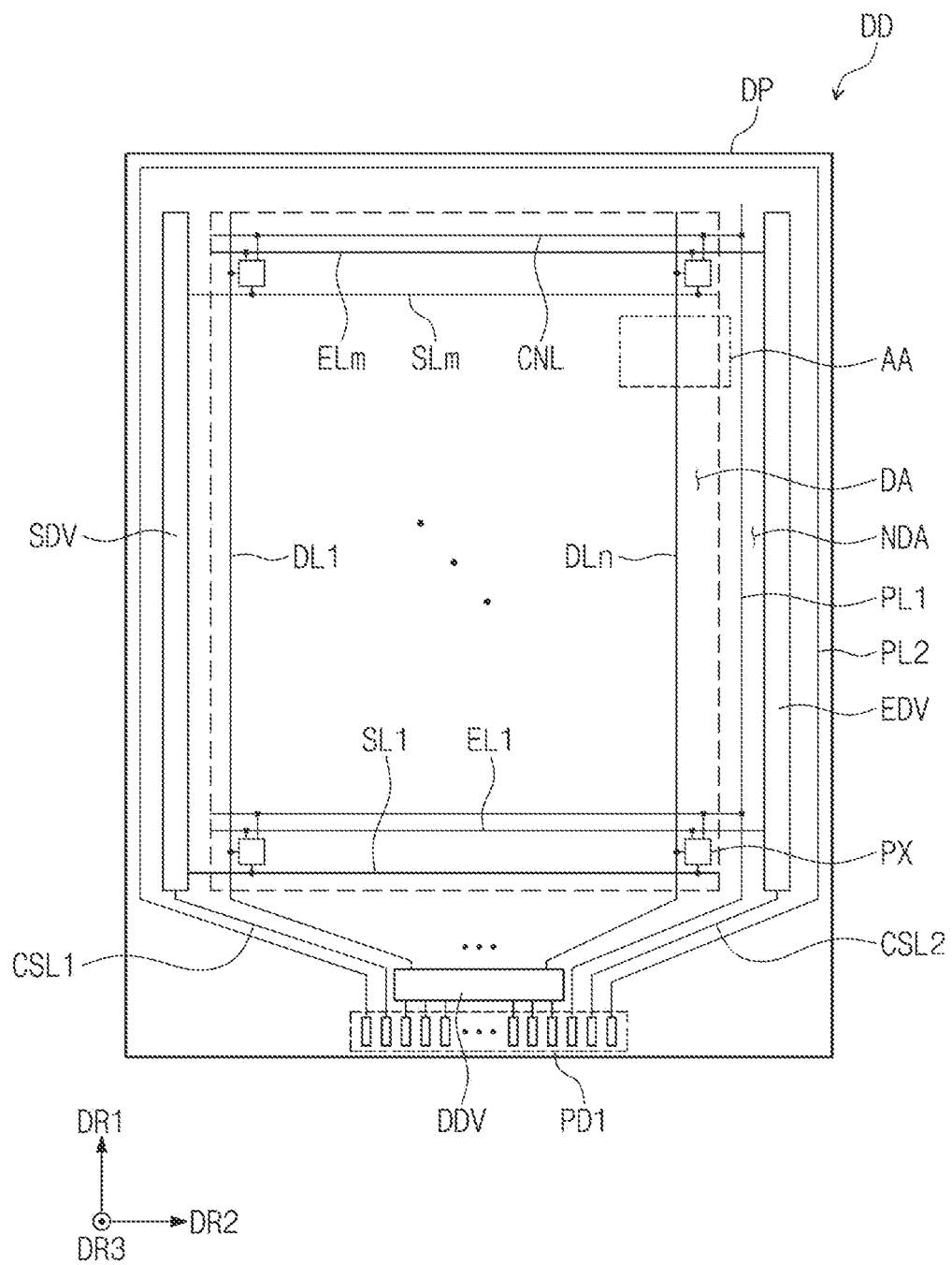
FIG. 4 is a plan view of the display panel shown in FIG. 2 according to some embodiments of the present disclosure.

FIG. 4 is a plan view of the display panel DP shown in FIG. 2.

Referring to FIG. 4, the display device DD may include the display panel DP, a scan driver SDV, a data driver DDV, a light emission driver EDV, and a plurality of pads PD1.

The display panel DP may have a rectangular shape having long sides extending in the first direction DR1 and short sides extending in the second direction DR2, however, the shape of the display panel DP should not be limited thereto or thereby. The display panel DP may include the display area DA and the non-display area NDA surrounding the display area DA.

The display panel DP may include a plurality of pixels PX, a plurality of scan lines SL1 to SLm, a plurality of data lines DL1 to DLn, a plurality of emission lines EL1 to Elm, first and second control lines CSL1 and CSL2, first and second power lines PL1 and PL2, and connection lines CNL. Each of "m" and "n" is a natural number.

The pixels PX may be arranged in the display area DA. The scan driver SDV and the light emission driver EDV may be located in the non-display area NDA respectively adjacent to the long sides of the display panel DP. The data driver DDV may be located in the non-display area NDA to be adjacent to one short side of the short sides of the display panel DP. When viewed in a plane or in a plan view, the data driver DDV may be located to be adjacent to a lower end of the display panel DP.

The scan lines SL1 to SLm may extend in the second direction DR2 and may be connected to the pixels PX and the scan driver SDV. The data lines DL1 to DLn may extend in the first direction DR1 and may be connected to the pixels PX and the data driver DDV. The emission lines EL1 to ELm may extend in the second direction DR2 and may be connected to the pixels PX and the light emission driver EDV.

The first power line PL1 may extend in the first direction DR1 and may be located in the non-display area NDA. The first power line PL1 may be located between the display area DA and the light emission driver EDV, however, embodiments according to the present disclosure are not limited thereto or thereby. According to some embodiments, the first power line PL1 may be located between the display area DA and the scan driver SDV.

The connection lines CNL may extend in the second direction DR2 and may be arranged in the first direction DR1. The connection lines CNL may be connected to the first power line PL1 and the pixels PX. A first voltage may be applied to the pixels PX via the first power line PL1 and the connection lines CNL connected to the first power line PL1.

The second power line PL2 may be located in the non-display area NDA. The second power line PL2 may extend along the long sides of the display panel DP and the other short side at which the data driver DDV is not located in the display panel DP. The second power line PL2 may be located outside the scan driver SDV and the light emission driver EDV.

According to some embodiments, the second power line PL2 may extend toward the display area DA and may be connected to the pixels PX. A second voltage having a level lower than that of the first voltage may be applied to the pixels PX via the second power line PL2.

The first control line CSL1 may be connected to the scan driver SDV and may extend toward the lower end of the display panel DP. The second control line CSL2 may be connected to the light emission driver EDV and may extend toward the lower end of the display panel DP. The data driver DDV may be located between the first control line CSL1 and the second control line CSL2.

The pads PD1 may be located in the non-display area NDA adjacent to the lower end of the display panel DP. The pads PD1 may be located closer to the lower end of the display panel DP than the data driver DDV is. The data driver DDV, the first and second power lines PL1 and PL2, the first and second control lines CSL1 and CSL2 may be connected to the pads PD. The data lines DL1 to DLn may be connected to the data driver DDV, and the data driver DDV may be connected to the pads PD1 corresponding to the data lines DL1 to DLn.

According to some embodiments, the display device DD may further include a timing controller to control an operation of the scan driver SDV, the data driver DDV, and the light emission driver EDV and a voltage generator to generate the first and second voltages. The timing controller and the voltage generator may be mounted on a printed circuit board and may be connected to corresponding pads PD1 through the printed circuit board.

The scan driver SDV may generate a plurality of scan signals, and the scan signals may be applied to the pixels PX through the scan lines SL1 to SLm. The data driver DDV may generate a plurality of data voltages, and the data voltages may be applied to the pixels PX through the data lines DL1 to DLn. The light emission driver EDV may generate a plurality of emission signals, and the emission signals may be applied to the pixels PX through the emission lines EL1 to ELm.

The pixels PX may receive the data voltages in response to the scan signals. The pixels PX may emit a light having a luminance corresponding to the data voltages in response to the emission signals, and thus, the images may be displayed.

Figure 5:
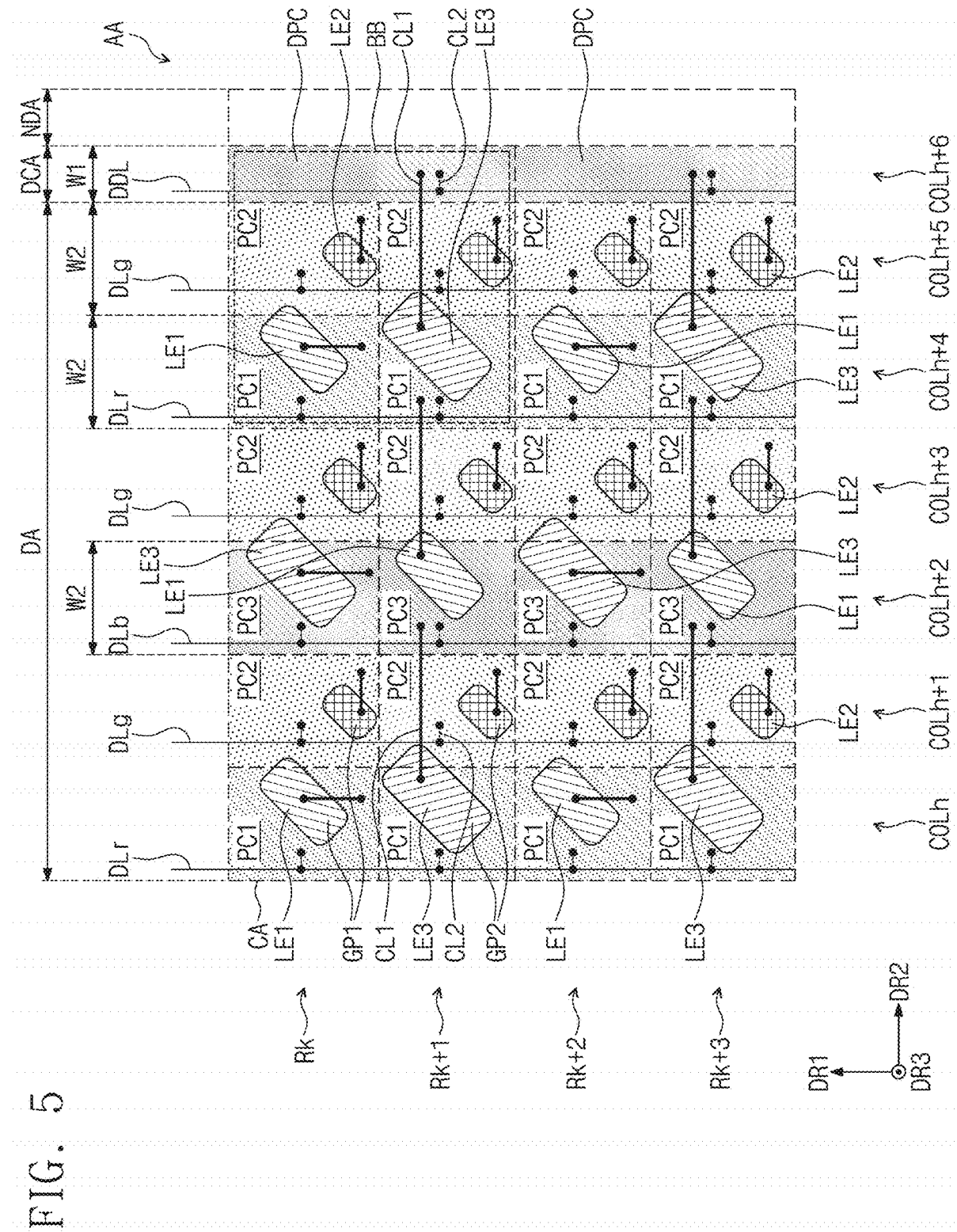
FIG. 5 is an enlarged plan view of an area AA shown in FIG. 4 according to some embodiments of the present disclosure.
Figure 6:
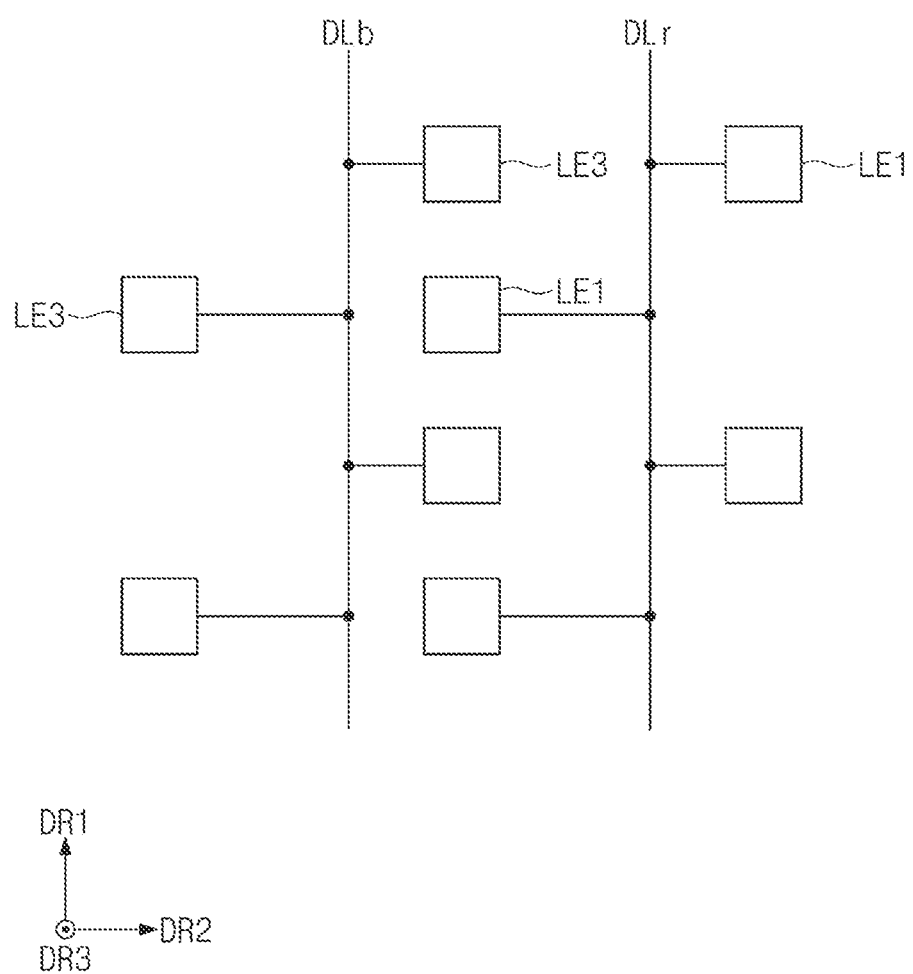
FIG. 6 is a view of first light emitting elements connected to a first data line and third light emitting elements connected to a third data line shown in FIG. 5 according to some embodiments of the present disclosure.

FIG. 5 is an enlarged plan view of an area AA shown in FIG. 4. FIG. 6 is a view of first light emitting elements connected to a first data line and third light emitting elements connected to a third data line shown in FIG. 5.

Referring to FIGS. 5 and 6, the pixels PX shown in FIG. 4 may include a plurality of first light emitting elements LE1, a plurality of first pixel circuits PC1, a plurality of second light emitting elements LE2, a plurality of second pixel circuits PC2, a plurality of third light emitting elements LE3, and a plurality of third pixel circuits PC3 shown in FIG. 5. The display panel DP may further include a plurality of dummy pixel circuits DPC.

As an example, the first, second, and third pixel circuits PC1, PC2, and PC3 and the dummy pixel circuits DPC are shown in boxes indicated with dotted lines to be distinguished from each other in FIG. 5. As an example, the first, second, and third pixel circuits PC1, PC2, and PC3 and the dummy pixel circuits DPC are shown in FIG. 5 as boxes indicated with the dotted lines and arranged in four rows Rk to Rk+3 by seven columns COLh to COLh+6. According to some embodiments, each of k and h is a natural number.

The first, second, and third light emitting elements LE1, LE2, and LE3 and the first, second, and third pixel circuits PC1, PC2, and PC3 may be located in the display area DA. An area adjacent to a right side of the display area DA may be defined as a dummy circuit area DCA. The dummy circuit area DCA may be located between the display area DA and the non-display area NDA. The dummy pixel circuits DPC may be located in the dummy circuit area DCA. The dummy circuit area DCA in which the dummy pixel circuits DPC are arranged to drive the third light emitting elements LE3 may be defined as the display area DA.

As an example, the first light emitting elements LE1 may emit a red light, the second light emitting elements LE2 may emit a green light, and the third light emitting elements LE3 may emit a blue light. When viewed in the plane or in a plan view, each of the first light emitting elements LE1 may have a size greater than a size of each of the second light emitting elements LE2 and smaller than a size of each of the third light emitting elements LE3.

The first light emitting elements LE1 and the third light emitting elements LE3 may be alternately arranged with each other in the first direction DR1. In addition, the first light emitting elements LE1 and the third light emitting elements LE3 may be alternately arranged with each other in the second direction DR2. The second light emitting elements LE2 may be arranged in the first direction DR1.

The first light emitting element LE1 and the second light emitting element LE2, which are adjacent to each other in the second direction DR2, may form a first pixel group GP1. The third light emitting element LE3 and the second light emitting element LE2, which are adjacent to each other in the second direction DR2, may form a second pixel group GP2. The first pixel group GP1 may be alternately arranged with the second pixel group GP2 in the first direction DR1 and the second direction DR2.

According to the above structure, the first and third light emitting elements LE1 and LE3 may be alternately arranged with each other in each of an h-th column COLh-th and an (h+4)th column COLh+4 along the first direction DR1. The first and third light emitting elements LE1 and LE3 may be alternately arranged with each other in an (h+2)th column COLh+2 along the first direction DR1. The column may correspond to the first direction DR1. The row may correspond to the second direction DR2.

The second light emitting elements LE2 may be arranged in each of an (h+1)th column COLh+1 and an (h+3)th column COLh+3 along the first direction DR1.

The first and third light emitting elements LE1 and LE3 arranged in the (h+2)th column COLh+2 may be arranged staggered with respect to the first and third light emitting elements LE1 and LE3 arranged in each of the h-th and (h+4)th columns COLh and COLh+4. As an example, the first and third light emitting elements LE1 and LE3 may be arranged in order of the first light emitting element LE1 and the third light emitting element LE3 in each of the h-th and (h+4)th columns COLh and COLh+4, and the first and third light emitting elements LE1 and LE3 may be arranged in order of the third light emitting element LE3 and the first light emitting element LE1 in the (h+2)th column COLh+2.

According to some embodiments, in the h-th and (h+4)th columns COLh and COLh+4, the first light emitting elements LE1 may be arranged in k-th and (k+2)th rows Rk and Rk+2, and the third light emitting elements LE3 may be arranged in (k+1)th and (k+3)th rows Rk+1 and Rk+3. In the (h+2)th column COLh+2, the third light emitting elements LE3 may be arranged in the k-th and (k+2)th rows Rk and Rk+2, and the first light emitting elements LE1 may be arranged in the (k+1)th and (k+3)th rows Rk+1 and Rk+3.

The data lines DL1 to DLn shown in FIG. 4 may include first data lines DLr, a second data line DLg, third data lines DLb, and a dummy data line DDL shown in FIG.

The first pixel circuits PC1 may be arranged in the h-th and (h+4)th columns COLh and COLh+4. The first pixel circuits PC1 may be arranged under the first and third light emitting elements LE1 and LE3 arranged in each of the h-th and (h+4)th columns COLh and COLh+4. The first data lines DLr may be respectively arranged in the h-th and (h+4)th columns COLh and COLh+4. The first data lines DLr may be connected to the first pixel circuits PC1.

The first light emitting elements LE1 arranged in the h-th and (h+4)th columns COLh and COLh+4 may be respectively connected to the first pixel circuits PC1 arranged under the first light emitting elements LE1. The third light emitting elements LE3 arranged in the h-th and (h+4)th columns COLh and COLh+4 may not be connected to the first pixel circuits PC1 arranged under the third light emitting elements LE3. In the h-th and (h+4)th columns COLh and COLh+4, the first data lines DLr may be connected to the first light emitting elements LE1 via the first pixel circuits PC1 connected to the first light emitting elements LE1.

The third pixel circuits PC3 may be arranged in the (h+2)th column COLh+2. The third pixel circuits PC3 may be arranged under the first and third light emitting elements LE1 and LE3 arranged in the (h+2)th column COLh+2. The third data line DLb may be arranged in the (h+2)th column COLh+2. The third data line DLb may be connected to the third pixel circuits PC3.

The third light emitting elements LE3 arranged in the (h+2)th column COLh+2 may be respectively connected to the third pixel circuits PC3 arranged under the third light emitting elements LE3. The first light emitting elements LE1 arranged in the (h+2)th column COLh+2 may not be connected to the third pixel circuits PC3 arranged under the first light emitting elements LE1. In the (h+2)th column COLh+2, the third data line DLb may be connected to the third light emitting elements LE3 via the third pixel circuits PC3 connected to the third light emitting elements LE3.

The third light emitting elements LE3 arranged in the h-th column COLh may be connected to the third pixel circuits PC3 arranged under the first light emitting elements LE1 in the (h+2)th column COLh+2. The third data line DLb arranged in the (h+2)th column COLh+2 may be connected to the third light emitting elements LE3 arranged in the h-th column COLh via the third pixel circuits PC3 arranged under the first light emitting elements LE1. Accordingly, as shown in FIG. 6, the third data line DLb may be connected to the third light emitting elements LE3 emitting the same color light.

The third light emitting elements LE3 arranged in the h-th column COLh may be connected to the third pixel circuits PC3 arranged in the (h+2)th column COLh+2 via the first connection lines CL1. The first connection lines CL1 may extend from anodes of the third light emitting elements LE3. The first connection lines CL1 may extend from the third light emitting elements LE3 arranged in the h-th column COLh to the third pixel circuits PC3 arranged in the (h+2)th column COLh+2.

The third data line DLb arranged in the (h+2)th column COLh+2 may be connected to the third pixel circuits PC3 via the second connection lines CL2. The first connection lines CL1 and the second connection lines CL2 may be located on different layers from each other. As an example, the first connection lines CL1 may be located on a layer positioned higher than the second connection lines CL2.

Additionally, in FIG. 5, lines connecting the light emitting elements LE1, LE2, and LE3 and the pixel circuits PC1, PC2, and PC3 may be defined as the first connection lines CL1 described above, and lines connecting the data lines DLr, DLb, and DLg and the pixel circuits PC1, PC2, and PC3 may be defined as the second connection lines CL2 described above. In addition, lines connecting the third light emitting elements LE3 and the dummy pixel circuits DPC may be defined as the first connection lines CL1 described above, and lines connecting the dummy data line DDL and the dummy pixel circuits DPC may be defined as the second connection lines CL2 described above. In FIG. 5, the first connection lines CL1 are indicated by a bold line, and the second connection lines CL2 are indicated by a thin line.

The first light emitting elements LE1 arranged in the (h+2)th column COLh+2 may be connected to the first pixel circuits PC1 arranged under the third light emitting elements LE3 in the (h+4)th column COLh+4. In the (h+4)th column COLh+4, the first data line DLr may be connected to the first light emitting elements LE1 arranged in the (h+2)th column COLh+2 via the first pixel circuits PC1 arranged under the third light emitting elements LE3. Accordingly, as shown in FIG. 6, the first data line DLr may be connected to the first light emitting elements LE1 emitting the same color light.

The first light emitting elements LE1 arranged in the (h+2)th column COLh+2 may be connected to the first pixel circuits PC1 arranged in the (h+4)th column COLh+4 via the first connection lines CL1. The first data line DLr arranged in the (h+4)th column COLh+4 may be connected to the first pixel circuits PC1 via the second connection lines CL2.

The second pixel circuits PC2 may be arranged in the (h+1)th column COLh+1, the (h+3)th column COLh+3, and an (h+5)th column COLh+5. The second pixel circuits PC2 may be arranged under the second light emitting elements LE2.

The second data line DLg may be arranged in each of the (h+1)th column COLh+1, the (h+3)th column COLh+3, and the (h+5)th column COLh+5. The second data lines DLg may be connected to the second pixel circuits PC2. The second data lines DLg may be connected to the second light emitting elements LE2 via the second pixel circuits PC2.

The first and third pixel circuits PC1 and PC3 arranged in the (h+4)th column COLh+4 may be closer to the dummy circuit area DCA than the first and third pixel circuits PC1 and PC3 arranged in the h-th and (h+2)th columns COLh and COLh+2 are. The second pixel circuits PC2 arranged in the (h+5)th column COLh+5 may be closer to the dummy circuit area DCA than the second pixel circuits PC2 arranged in the (h+1)th and (h+3)th columns COLh+1 and COLh+3 are. The dummy pixel circuits DPC may be arranged in an (h+6)th column COLh+6. The dummy pixel circuits DPC may be connected to the third light emitting elements LE3 arranged in the (h+4)th column COLh+4. The dummy data line DDL may be connected to the dummy pixel circuits DPC. The dummy data line DDL may be connected to the third light emitting elements LE3 arranged in the (h+4)th column COLh+4 via the dummy pixel circuits DPC.

The third light emitting elements LE3 arranged in the (h+4)th column COLh+4 may be connected to the dummy pixel circuits DPC via the first connection lines CL1. The dummy data line DDL may be connected to the dummy pixel circuits DPC via the second connection lines CL2.

Hereinafter, configurations of four light emitting elements LE1, LE2, and LE3 and the dummy pixel circuit DPC arranged in an area BB of FIG. 5 will be described as a representative example to explain in more detail a connection relationship between the light emitting elements LE1, LE2, and LE3 adjacent to the dummy circuit area DCA and the dummy pixel circuits DPC.

The four light emitting elements LE1, LE2, and LE3 arranged in the (h+4)th and (h+5)th columns COLh+4 and COLh+5 and the k-th and (k+1)th rows Rk and Rk+1 may be arranged in the area BB. The four light emitting elements LE1, LE2, and LE3 arranged in the area BB may be adjacent to one dummy pixel circuit DPC.

The third light emitting element LE3 may be adjacent to the first light emitting element LE1 in the first direction DR1. The second light emitting elements LE2 may be adjacent to each of the first and third light emitting elements LE1 and LE3 in the second direction DR2. The second light emitting elements LE2 may be arranged between the first and third light emitting elements LE1 and LE3 and the dummy circuit area DCA.

The first pixel circuits PC1 may be arranged under the first and third light emitting elements LE1 and LE3, respectively, and the second pixel circuits PC2 may be arranged under the second light emitting elements LE2, respectively. The first light emitting element LE1 may be connected to the first pixel circuit PC1 arranged under the first light emitting element LE1, and the third light emitting element LE3 may be connected to the dummy pixel circuit DPC. The second light emitting elements LE2 may be respectively connected to the second pixel circuits PC2. The dummy pixel circuit DPC may be located on the same layer as the first and second pixel circuits PC1 and PC2.

The dummy pixel circuit DPC may have a first width W1 smaller than a second width W2 of each of the first pixel circuits PC1 in the second direction DR2. The first width W1 of the dummy pixel circuit DPC may be smaller than a second width W2 of each of the second pixel circuits PC2 in the second direction DR2. The third pixel circuits PC3 may have the same second width W2 as the first and second pixel circuits PC1 and PC2 in the second direction DR2. The dummy pixel circuit DPC may have a length longer than that of each of the first, second, and third pixel circuits PC1, PC2, and PC3 in the first direction DR1.

When viewed in the second direction DR2, the dummy pixel circuit DPC may be arranged to overlap two first pixel circuits PC1 arranged in the first direction DR1. The dummy pixel circuit DPC may be located in an area corresponding to the two first pixel circuits PC1 arranged in the first direction DR1 and may have the first width W1 smaller than that of the first pixel circuits PC1.

When viewed in the second direction DR2, the dummy pixel circuit DPC may be arranged to overlap two second pixel circuits PC2 arranged in the first direction DR1 or two third pixel circuits PC3 arranged in the first direction DR1.

When viewed in the plane, the area of the dummy pixel circuit DPC may be smaller than a sum of areas of the two first pixel circuits PC1. In addition, the area of the dummy pixel circuit DPC may be smaller than a sum of areas of the two second pixel circuits PC2 or a sum of areas of the two third pixel circuits PC3.

The first pixel circuit PC1 located under the third light emitting element LE3 of the area BB may be connected to the first light emitting element LE1 arranged in the (k+1)th row Rk+1 and the (h+2)th column COLh+2. The first light emitting element LE1 arranged in the (k+1)th row Rk+1 and the (h+2)th column COLh+2 may be spaced apart from the third light emitting element LE3 arranged in the area BB in the second direction DR2.

The number of the dummy pixel circuits DPC may be smaller than the number of the pixel circuits arranged in each column. As an example, the number of the dummy pixel circuits DPC may be smaller than the number of the first pixel circuits PC1 arranged in the (h+4)th column COLh+4. According to some embodiments, the number of the dummy pixel circuits DPC may correspond to a half of the number of the first pixel circuits PC1 arranged in the (h+4)th column COLh+4. One dummy pixel circuit DPC may be arranged to correspond to two first pixel circuits PC1.

In a case where the number and the area of the dummy pixel circuits arranged in the dummy circuit area DCA are the same as those of the first pixel circuits PC1 arranged in the (h+4)th column COLh+4, the dummy circuit area DCA may be expanded.

However, according to the present disclosure, the number of the dummy pixel circuits DPC located in the dummy circuit area DCA may be smaller than that of the first pixel circuits PC1 and the width of the dummy pixel circuit DPC may be smaller than that of the first pixel circuit PC1. As an example, the dummy pixel circuit DPC may have the first width W1 smaller than that of the first pixel circuits PC1 and may be located in the area corresponding the two first pixel circuits PC1. Accordingly, the dummy circuit area DCA for the dummy pixel circuit DPC may be reduced.

Circuit configurations and structures of the first, second, and third pixel circuits PC1, PC2, and PC3 and the dummy pixel circuits DPC will be described in more detail below.

The structure in which the third light emitting elements LE3 are connected to the dummy pixel circuits DPC is described as a representative example, however, the present disclosure should not be limited thereto or thereby. As an example, in a case where the (h+4)th and (h+5)th columns COLh+4 and COLh+5 are removed, the first light emitting elements LE1 arranged in the (h+2)th column COLh+2 may be connected to the dummy pixel circuits DPC.

In the case where the pixels PX of the display area DA are arranged in the same manner as shown in FIG. 5, the dummy pixel circuits DPC may be arranged in the dummy circuit area DCA adjacent to a right side of the display area DA, however, the present disclosure should not be limited thereto or thereby. According to some embodiments, in a case where the pixels PX shown in FIG. 5 are inverted left and right, the dummy pixel circuits DPC may be located in the dummy circuit area DCA adjacent to a left side of the display area DA.

Figure 7:
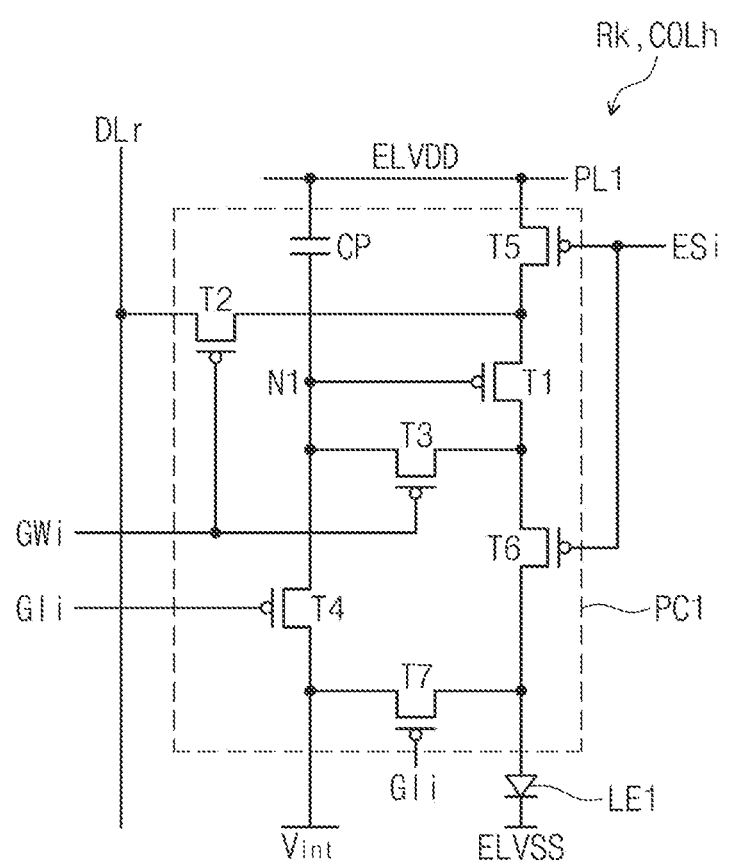
FIG. 7 is a circuit diagram of a first pixel circuit located in a k-th row and an h-th column shown in FIG. 5 according to some embodiments of the present disclosure.
Figure 8:
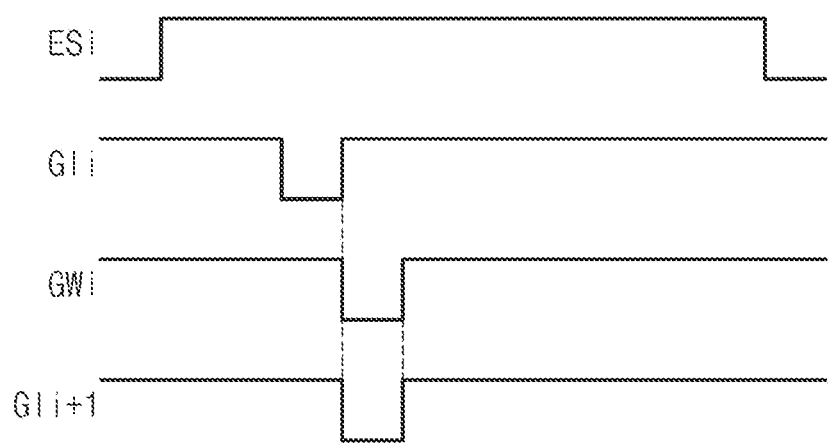
FIG. 8 is a timing diagram of signals shown in FIG. 7 according to some embodiments of the present disclosure.
Figure 9:
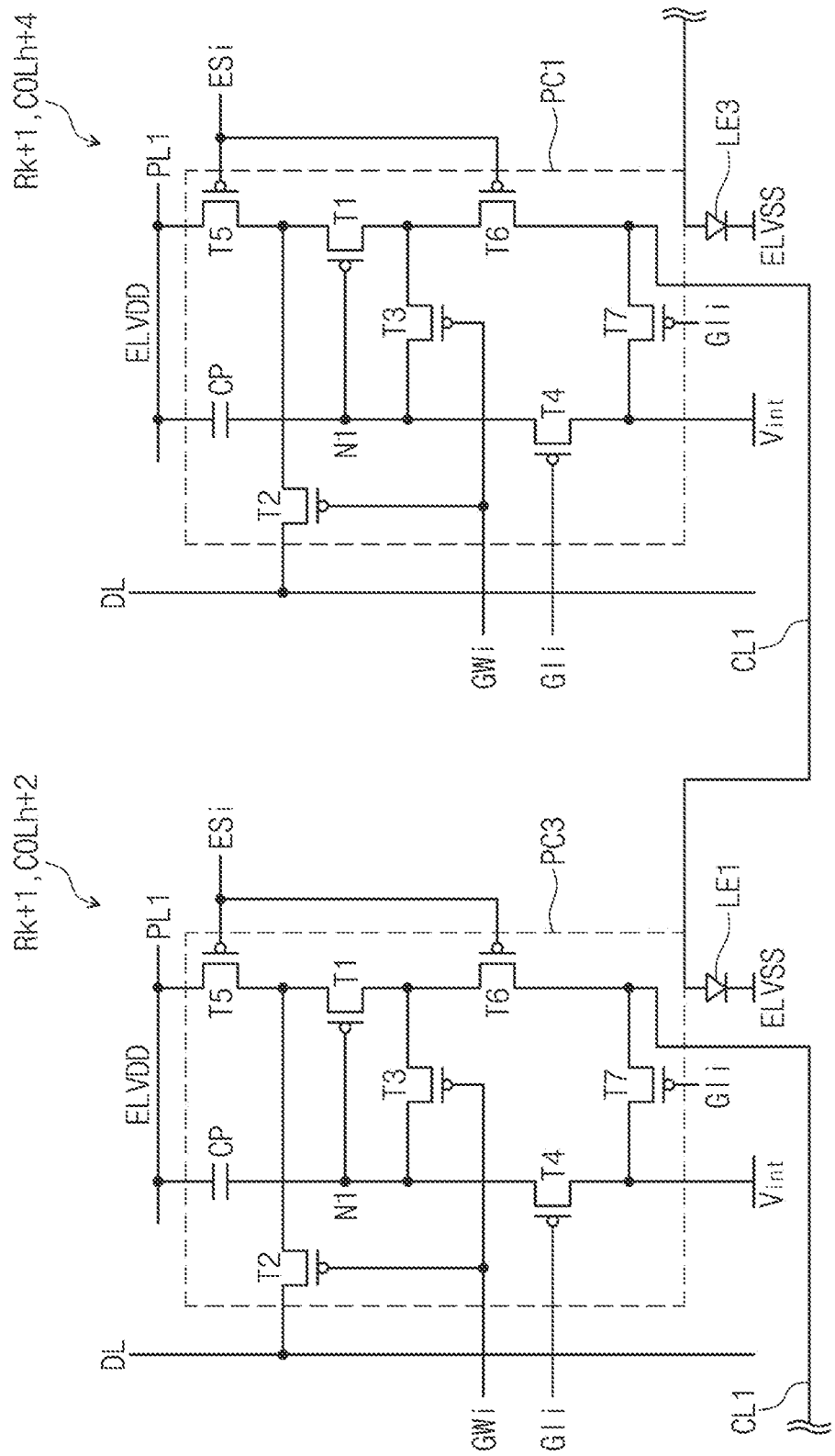
FIG. 9 is a circuit diagram of a third pixel circuit in a (k+1)th row and an (h+2)th column and a first pixel circuit located in a (k+1)th row and an (h+4)th column shown in FIG. 5 according to some embodiments of the present disclosure.

FIG. 7 is a circuit diagram of the first pixel circuit located in the k-th row and the h-th column shown in FIG. 5. FIG. 8 is a timing diagram of signals shown in FIG. 7. FIG. 9 is a circuit diagram of the third pixel circuit located in the (k+1)th row and the (h+2)th column and the first pixel circuit located in the (k+1)th row and the (h+4)th column shown in FIG. 5.

Referring to FIGS. 7 and 8, the first light emitting element LE1 may be connected to the first pixel circuit PC1 and may be driven by the first pixel circuit PC1. The first pixel circuit PC1 may be connected to the first data line DLr.

The first pixel circuit PC1 may include a plurality of transistors T1 to T7 and a capacitor CP. The transistors T1 to T7 and the capacitor CP may control an amount of current flowing through the first light emitting element LE1 in response to the data voltage. The first light emitting element LE1 may emit a light at a predetermined luminance in response to the amount of current provided thereto.

Each of the transistors T1 to T7 may include an input electrode (or a source electrode), an output electrode (or a drain electrode), and a control electrode (or a gate electrode). In the following descriptions, for the convenience of explanation, one electrode of the input electrode and the output electrode may be referred to as a first electrode, and the other electrode of the input electrode and the output electrode may be referred to as a second electrode.

The transistors T1 to T7 may include first, second, third, fourth, fifth, sixth, and seventh transistors T1 to T7. The first transistor T1 may be defined as a driving transistor, and the second transistor T2 may be defined as a switching transistor. The third transistor T3 may be defined as a compensation transistor. The fourth transistor T4 and the seventh transistor T7 may be defined as initialization transistors. The fifth transistor T5 and the sixth transistor T6 may be defined as emission control transistors.

The first light emitting element LE1 may be defined as an organic light emitting element. The first light emitting element LE1 may include an anode and a cathode. The anode of the first light emitting element LE1 may be connected to the first power line PL1 via the sixth, first, and fifth transistors T6, T1, and T5. A first voltage ELVDD may be applied to the anode of the first light emitting element LE1 via the first power line PL1.

The cathode of the first light emitting element LE1 may receive a second voltage ELVSS having a voltage level lower than that of the first voltage ELVDD. The second voltage ELVSS may be applied to the first light emitting element LE1 via the second power line PL2 shown in FIG. 4.

The first transistor T1 may be connected to the fifth transistor T5 and the sixth transistor T6. The first transistor T1 may include a first electrode connected to the first power line PL1 via the fifth transistor T5, a second electrode connected to the anode of the first light emitting element LE1 via the sixth transistor T6, and a control electrode connected to a first node N1. The first electrode of the first transistor T1 may be connected to the fifth transistor T5, and the second electrode of the first transistor T1 may be connected to the sixth transistor T6.

The first electrode of the first transistor T1 may receive the first voltage ELVDD via the fifth transistor T5. The first transistor T1 may control the amount of current flowing through the first light emitting element LE1 in response to the voltage applied to the control electrode of the first transistor T1.

The second transistor T2 may be connected to the first data line DLr and the first electrode of the first transistor T1. The second transistor T2 may include a first electrode connected to the first data line DLr, a second electrode connected to the first electrode of the first transistor T1, and a control electrode receiving an i-th write scan signal GWi.

The second transistor T2 may be turned on in response to the i-th write scan signal GWi and may electrically connect the first data line DLr and the first electrode of the first transistor T1. The second transistor T2 may perform a switching operation to apply the data voltage applied thereto via the first data line DLr to the first electrode of the first transistor T1.

The third transistor T3 may be connected to the second electrode of the first transistor T1 and the first node N1. The third transistor T3 may include a first electrode connected to the second electrode of the first transistor T1, a second electrode connected to the first node N1, and a control electrode receiving the i-th write scan signal GWi.

The third transistor T3 may be turned on in response to the i-th write scan signal GWi and may electrically connect the second electrode of the first transistor T1 and the control electrode of the first transistor T1. When the third transistor T3 is turned on, the first transistor T1 and the third transistor T3 may be connected in a diode configuration.

The fourth transistor T4 may be connected to the first node N1 and may receive an initialization voltage Vint. The fourth transistor T4 may include a first electrode connected to the first node N1, a second electrode receiving the initialization voltage Vint, and a control electrode receiving an i-th initialization scan signal Gli. The fourth transistor T4 may be turned on in response to the i-th initialization scan signal Gli and may provide the initialization voltage Vint to the first node N1.

The fifth transistor T5 may be connected to the first power line PL1 and the first transistor T1. The fifth transistor T5 may include a first electrode connected to the first power line PL1, a second electrode connected to the first electrode of the first transistor T1, and a control electrode receiving an i-th emission signal ESi.

The sixth transistor T6 may be connected to the first transistor T1 and the first light emitting element LE1. The sixth transistor T6 may include a first electrode connected to the second electrode of the first transistor T1, a second electrode connected to the anode of the first light emitting element LE1, and a control electrode receiving the i-th emission signal ESi.

The fifth transistor T5 and the sixth transistor T6 may be turned on in response to the i-th emission signal ESi. The first voltage ELVDD may be provided to the first light emitting element LE1 by the turned-on fifth transistor T5 and sixth transistor T6, and thus, a driving current may flow through the first light emitting element LE1. Accordingly, the first light emitting element LE1 may emit a light.

The seventh transistor T7 may receive the initialization voltage Vint and may be connected to the first light emitting element LE1. The seventh transistor T7 may include a first electrode connected to the anode of the first light emitting element LE1, a second electrode receiving the initialization voltage Vint, and a control electrode receiving the i-th initialization scan signal Gli.

The seventh transistor T7 may be turned on in response to the i-th initialization scan signal Gli and may provide the initialization voltage Vint to the anode of the first light emitting element LE1. According to some embodiments, the seventh transistor T7 may be omitted.

The capacitor CP may be connected to the first power line PL1 and the first node N1. The capacitor CP may include a first electrode connected to the first power line PL1 and a second electrode connected to the first node N1. When the fifth transistor T5 and the sixth transistor T6 are turned on, an amount of current flowing through the first transistor T1 may be determined according to a voltage charged in the capacitor CP.

Each of the transistors T1 to T7 may be a PMOS transistor, however, it should not be limited thereto or thereby. According to some embodiments, each of the transistors T1 to T7 may be an NMOS transistor.

Although the above descriptions are made with reference to the first pixel circuit PC1, the second and third pixel circuits PC2 and PC3 may also have substantially the same configuration as the first pixel circuit PC1.

Referring to FIG. 9, the first light emitting element LE1 and the third pixel circuit PC3 may be arranged in the (k+1)th row Rk+1 and the (h+2)th column COLh+2. The first light emitting element LE1 may not be connected to the third pixel circuit PC3 in the (k+1)th row Rk+1 and the (h+2)th column COLh+2.

The third light emitting element LE3 and the first pixel circuit PC1 may be arranged in the (k+1)th row Rk+1 and the (h+4)th column COLh+4. The third light emitting element LE3 may not be connected to the first pixel circuit PC1 in the (k+1)th row Rk+1 and the (h+4)th column COLh+4.

The first light emitting element LE1 arranged in the (k+1)th row Rk+1 and the (h+2)th column COLh+2 may be connected to the first pixel circuit PC1 arranged in the (k+1)th row Rk+1 and the (h+4)th column COLh+4. The first light emitting element LE1 may be connected to the first pixel circuit PC1 via the first connection line CL1 described above.

Figure 10:
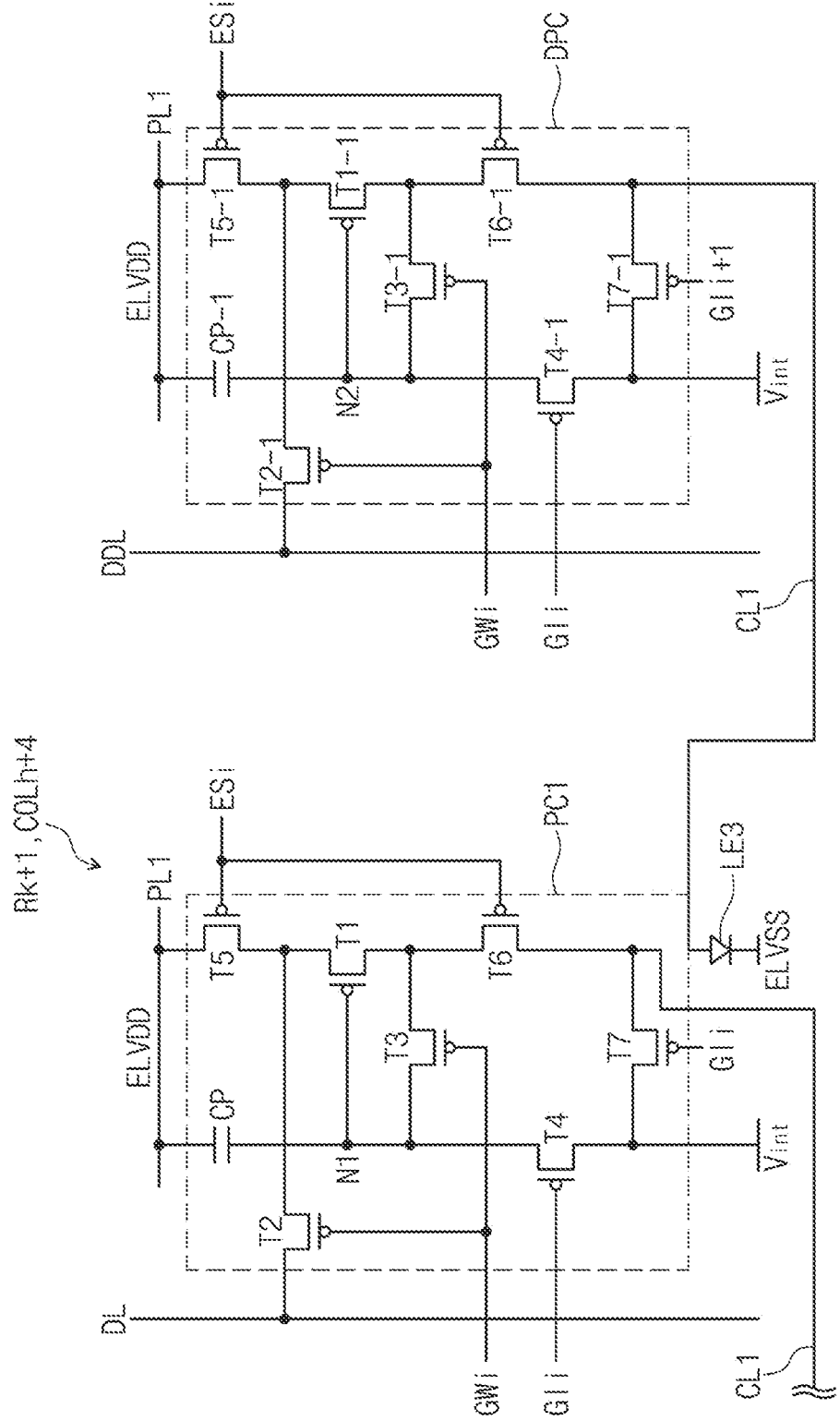
FIG. 10 is a circuit diagram of a first pixel circuit in a (k+1)th row and the (h+4)th column and a dummy pixel circuit adjacent to the first pixel circuit shown in FIG. 5 according to some embodiments of the present disclosure.

FIG. 10 is a circuit diagram of the first pixel circuit located in the (k+1)th row and the (h+4)th column and the dummy pixel circuit adjacent to the first pixel circuit shown in FIG. 5.

Referring to FIG. 10, the third light emitting element LE3 and the first pixel circuit PC1 may be arranged in the (k+1)th row Rk+1 and the (h+4)th column COLh+4. In the (k+1)th row Rk+1 and the (h+4)th column COLh+4, the third light emitting element LE3 may not be connected to the first pixel circuit PC1. The dummy pixel circuit DPC may be connected to the third light emitting element LE3 arranged in the (k+1)th row Rk+1 and the (h+4)th column COLh+4. The third light emitting element LE3 may be connected to the dummy pixel circuit DPC via the first connection line CL1 described above. The third light emitting element LE3 may be connected to the dummy pixel circuit DPC and may be driven by the dummy pixel circuit DPC.

The dummy pixel circuit DPC may include a plurality of transistors T1-1 to T7-1 and a capacitor CP-1. The circuit configuration of the dummy pixel circuit DPC may be substantially the same as the circuit configuration of the first pixel circuit PC1 shown in FIG. 7. Accordingly, a connection relationship between the transistors T1-1 to T7-1 and the capacitor CP-1 will be briefly described.

The transistors T1-1 to T7-1 may include first-first, second-first, third-first, fourth-first, fifth-first, sixth-first, and seventh-first transistors T1-1, T2-1, T3-1, T4-1, T5-1, T6-1, and T7-1. The anode of the third light emitting element LE3 may be connected to the sixth-first transistor T6-1, and the cathode of the third light emitting element LE3 may receive the second voltage ELVSS.

The first-first transistor T1-1 may include a first electrode connected to the first power line PL1 via the fifth-first transistor T5-1, a second electrode connected to the anode of the third light emitting element LE3 via the sixth-first transistor T6-1, and a control electrode connected to a second node N2.

The second-first transistor T2-1 may be connected to the dummy data line DDL and the first electrode of the first-first transistor T1-1. The second-first transistor T2-1 may include a first electrode connected to the dummy data line DDL, a second electrode connected to the first electrode of the first-first transistor T1-1, and a control electrode receiving the i-th write scan signal GWi.

The third-first transistor T3-1 may be connected to the second electrode of the first-first transistor T1-1 and the second node N2. The third-first transistor T3-1 may include a first electrode connected to the second electrode of the first-first transistor T1-1, a second electrode connected to the second node N2, and a control electrode receiving the i-th write scan signal GWi.

The fourth-first transistor T4-1 may be connected to the second node N2 and may receive the initialization voltage Vint. The fourth-first transistor T4-1 may include a first electrode connected to the second node N2, a second electrode receiving the initialization voltage Vint, and a control electrode receiving the i-th initialization scan signal Gli.

The fifth-first transistor T5-1 may be connected to the first power line PL1 and the first-first transistor T1-1. The fifth-first transistor T5-1 may include a first electrode connected to the first power line PL1, a second electrode connected to the first electrode of the first-first transistor T1-1, and a control electrode receiving the i-th emission signal ESi.

The sixth-first transistor T6-1 may be connected to the first-first transistor T1-1 and the third light emitting element LE3. The sixth-first transistor T6-1 may include a first electrode connected to the second electrode of the first-first transistor T1-1, a second electrode connected to the anode of the third light emitting element LE, and a control electrode receiving the i-th emission signal ESi.

The seventh-first transistor T7-1 may receive the initialization voltage Vint and may be connected to the third light emitting element LE3. The seventh-first transistor T7-1 may include a first electrode connected to the anode of the third light emitting element LE3, a second electrode receiving the initialization voltage Vint, and a control electrode receiving an (i+1)th initialization scan signal Gli+1. Different from the seventh transistor T7 of the pixel circuit PC, the seventh-first transistor T7-1 of the dummy pixel circuit DPC may be turned on in response to the (i+1)th initialization scan signal Gli+1.

The (i+1)th initialization scan signal Gli+1 may have substantially the same timing as the i-th write scan signal GWi. Substantially, the (i+1)th initialization scan signal Gli+1 and the i-th write scan signal GWi may be formed of the same signal. The i-th initialization scan signal Gli may be a signal generated at a timing prior to the (i+1)th initialization scan signal Gli+1 and the i-th write scan signal GWi.

The capacitor CP-1 may be connected to the first power line PL1 and the second node N2. The capacitor CP-1 may include a first electrode connected to the first power line PL1 and a second electrode connected to the second node N2.

Each of the transistors T1-1 to T7-1 may be a PMOS transistor, however, they should not be limited thereto or thereby. According to some embodiments, each of the transistors T1-1 to T7-1 may be an NMOS transistor.

Figure 11:
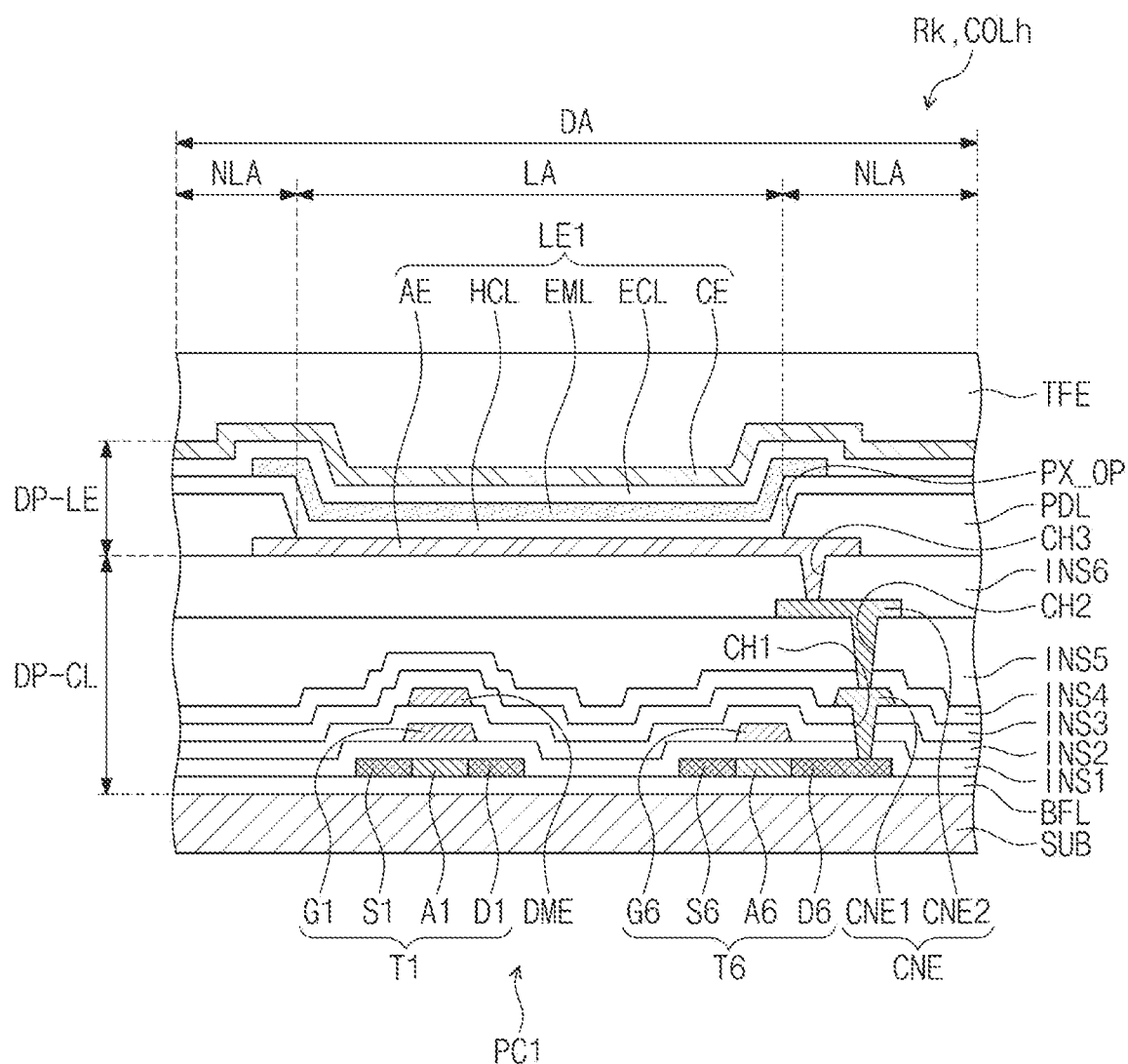
FIG. 11 is a cross-sectional view of a light emitting element, a first transistor, and a sixth transistor shown in FIG. 7 according to some embodiments of the present disclosure.

FIG. 11 is a cross-sectional view of the light emitting element, the first transistor, and the sixth transistor shown in FIG. 7.

Referring to FIG. 11, the first light emitting element LE1 may include a first electrode AE, a second electrode CE, a hole control layer HCL, an electron control layer ECL, and a light emitting layer EML. The first electrode AE may be an anode, and the second electrode CE may be a cathode.

The first and sixth transistors T1 and T6 and the first light emitting element LE1 may be located on a substrate SUB. The display area DA may include a light emitting area LA and a non-light-emitting area NLA around the light emitting area LA. The first light emitting element LE1 may be located in the light emitting area LA.

Because the first and sixth transistors T1 and T6 have substantially the same structure in cross-section, the structure in cross-section of the sixth transistor T6 will be described in more detail hereinafter, and details of the first transistor T1 will be omitted.

A buffer layer BFL may be located on the substrate SUB, and the buffer layer BFL may be an inorganic layer. A semiconductor layer S6, A6, and D6 may be located on the buffer layer BFL. The semiconductor layer S6, A6, and D6 may include polycrystalline silicon, amorphous silicon, or metal oxide.

The semiconductor layer S6, A6, and D6 may be doped with an N-type dopant or a P-type dopant. The semiconductor layer S6, A6, and D6 may include a high-doped region and a low-doped region. The high-doped region may have a conductivity greater than that of the low-doped region and may be formed as a sixth source area S6 and a sixth drain area D6. The low-doped region may be formed as a sixth channel area A6.

The sixth source area S6, the sixth channel area A6, and the sixth drain area D6 of the sixth transistor T6 may be formed by the semiconductor layer S6, A6, and D6. The sixth source area S6 and the sixth drain area D6 may substantially serve as a source electrode and a drain electrode of the sixth transistor T6.

A first insulating layer INS1 may be located on the semiconductor layer S6, A6, and D6. A sixth gate electrode G6 (or a control electrode) of the sixth transistor T6 may be located on the first insulating layer INS1.

A second insulating layer INS2 may be located on the sixth gate electrode G6. A dummy electrode DME may be located on the second insulating layer INS2. The dummy electrode DME may be located on a first gate electrode G1 (or a control electrode) of the first transistor T1 and may overlap the first gate electrode G1. A third insulating layer INS3 may be located on the second insulating layer INS2 to cover the dummy electrode DME.

A connection electrode CNE may be located between the sixth transistor T6 and the first light emitting element LE1. The connection electrode CNE may connect the sixth transistor T6 and the first light emitting element LE1. The connection electrode CNE may include a first connection electrode CNE1 and a second connection electrode CNE2 located on the first connection electrode CNE1.

The first connection electrode CNE1 may be located on the sixth transistor T6 and may be connected to the sixth transistor T6. The second connection electrode CNE2 may be located between the first connection electrode CNE1 and the first electrode AE and may be connected to the first connection electrode CNE1 and the first electrode AE.

The first connection electrode CNE1 may be located on the third insulating layer INS3 and may be connected to the sixth drain area D6 via a first contact hole CH1 defined through the first to third insulating layers INS1 to INS3. A fourth insulating layer INS4 may be located on the third insulating layer INS3 to cover the first connection electrode CNE1. A fifth insulating layer INS5 may be located on the fourth insulating layer INS4.

The second connection electrode CNE2 may be located on the fifth insulating layer INS5. The second connection electrode CNE2 may be connected to the first connection electrode CNE1 via a second contact hole CH2 defined through the fourth insulating layer INS4 and the fifth insulating layer INS5.

A sixth insulating layer INS6 may be located on the second connection electrode CNE2. Layers from the buffer layer BFL to the sixth insulating layer INS6 may be defined as the circuit element layer DP-CL. Each of the first insulating layer INS1 to the sixth insulating layer INS6 may be an inorganic layer or an organic layer.

The first electrode AE may be located on the sixth insulating layer INS6. The first electrode AE may be connected to the second connection electrode CNE2 via a third contact hole CH3 defined through the sixth insulating layer INS6. A pixel definition layer PDL that exposes a predetermined portion of the first electrode AE may be located on the first electrode AE and the sixth insulating layer INS6. An opening PX_OP may be defined through the pixel definition layer PDL to expose the predetermined portion of the first electrode AE.

The hole control layer HCL may be located on the first electrode AE and the pixel definition layer PDL. The hole control layer HCL may be commonly located in the light emitting area LA and the non-light-emitting area NLA. The hole control layer HCL may include a hole transport layer and a hole injection layer.

The light emitting layer EML may be located on the hole control layer HCL. The light emitting layer EML may be arranged in an area corresponding to the opening PX_OP. The light emitting layer EML may include an organic material and/or an inorganic material. The light emitting layer EML may emit one of the red light, the green light, and the blue light.

The electron control layer ECL may be located on the light emitting layer EML and the hole control layer HCL. The electron control layer ECL may be commonly located in the light emitting area LA and the non-light-emitting area NLA. The electron control layer ECL may include an electron transport layer and an electron injection layer.

The second electrode CE may be located on the electron control layer ECL. The second electrode CE may be commonly arranged over the pixels PX. The thin film encapsulation layer TFE may be located on the first light emitting element LE1. A layer on which the first light emitting element LE1 is located may be defined as the display element layer DP-LE.

According to the above stack structure, the first pixel circuit PC1 may be located at a position lower than the first light emitting element LE1. Accordingly, the first, second, and third pixel circuits PC1, PC2, and PC3 may be located under the first, second, and third light emitting elements LE1, LE2, and LE3 in FIG. 5.

According to some embodiments, other transistors T2 to T5 and T7 may be located at a position lower than the first light emitting element LE1. The first to seventh transistors T1 to T7 may be distributed and arranged at various positions within the dotted box area of FIG. 5. When viewed in the plane, some transistors may overlap the first light emitting element LE1.

The first voltage ELVDD may be applied to the first electrode AE, and the second voltage ELVSS may be applied to the second electrode CE. Holes and electrons injected into the light emitting layer EML may be recombined to generate excitons, and the light emitting element LE may emit the light by the excitons that return to a ground state from an excited state. The light emitting element LE may emit the light, and thus, the image may be displayed.

Figure 12:
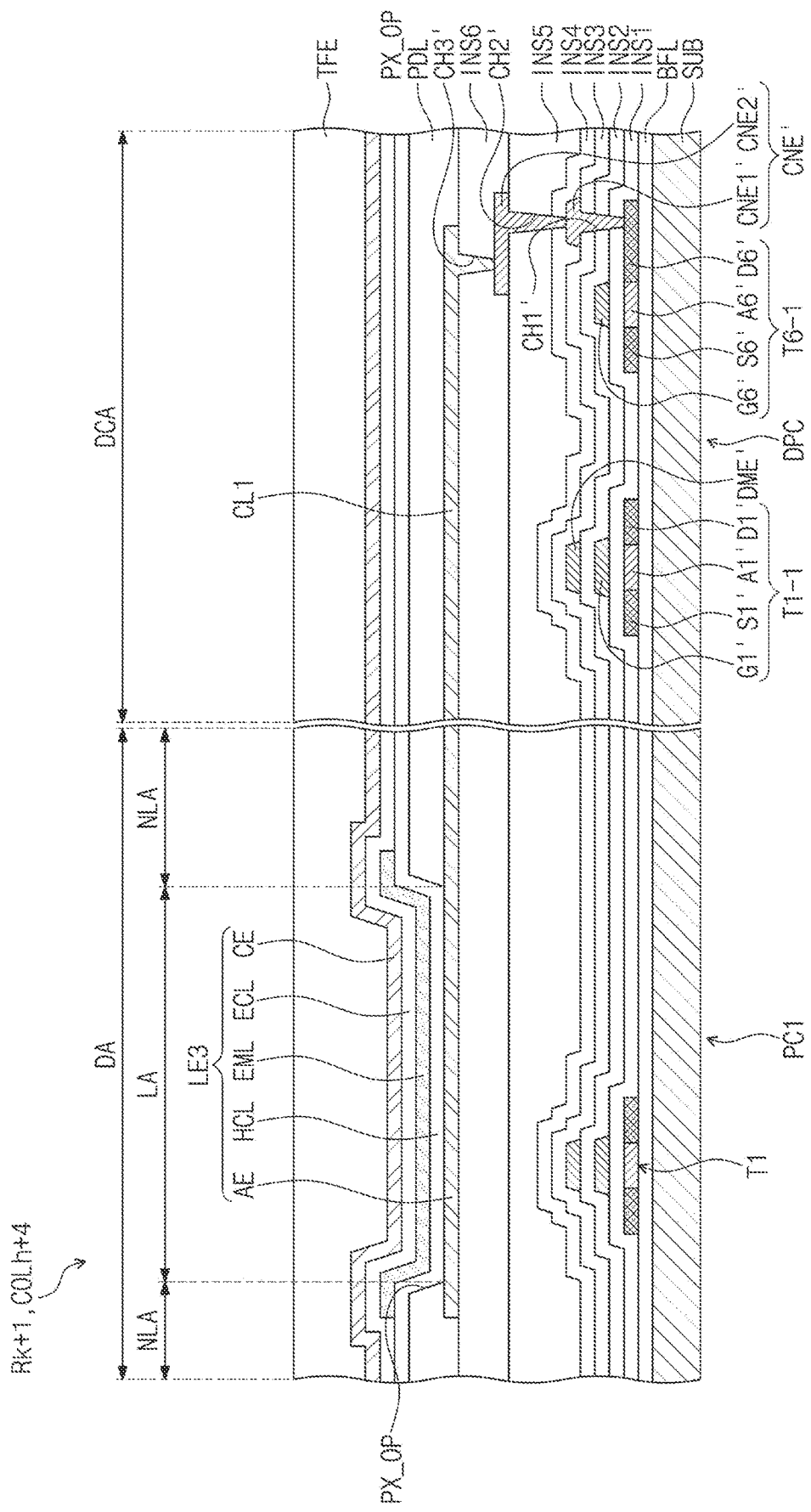
FIG. 12 is a cross-sectional view of a connection relationship between a dummy pixel circuit and a third light emitting element shown in FIG. 10 according to some embodiments of the present disclosure.

FIG. 12 is a cross-sectional view of a connection relationship between the dummy pixel circuit and the third light emitting element shown in FIG. 10.

Referring to FIG. 12, the third light emitting element LE3, the first-first transistor T1-1, and the sixth-first transistor T6-1 may have substantially the same structure in cross-section as that of the light emitting element LE1, the first transistor T1, and the sixth transistor T6 shown in FIG. 11. Accordingly, hereinafter, configurations different from those shown in FIG. 11 will be mainly described with reference to FIG. 12. In FIG. 12, only the first transistor T1 is illustrated under the third light emitting element LE3 as an example.

The first-first transistor T1-1 and the sixth-first transistor T6-1 may be arranged in the dummy circuit area DCA.

According to some embodiments, the second-first to fifth-first transistors T2-1 to T5-1 and the seventh-first transistor T7-1 of the dummy pixel circuit DPC may also be arranged in the dummy circuit area DCA.

The third light emitting element LE3 may be located in the display area DA. The first electrode AE of the third light emitting element LE3 may extend to the dummy circuit area DCA adjacent to the display area DA. The first electrode AE may extend to form the first connection line CL1.

The first electrode AE extending to the dummy circuit area DCA may be connected to the sixth-first transistor T6-1. As an example, the first connection line CL1 extending to the dummy circuit area DCA may be connected to a sixth drain area D6' of the sixth-first transistor T6-1 via first and second connection electrodes CNE1' and CNE2'. Accordingly, the third light emitting element LE3 may be connected to the dummy pixel circuit DPC located in the dummy circuit area DCA.

In the dummy circuit area DCA, the pixel definition layer PDL and the thin film encapsulation layer TFE may be located on the first connection line CL1. The third light emitting element LE3 may not be located in the dummy circuit area DCA.

The first transistor T1 of the first pixel circuit PC1 may be located under the third light emitting element LE3.

FIGS. 13A to 13E are plan views of a structure of the pixel circuit shown in FIG. 7.

Figure 13A:
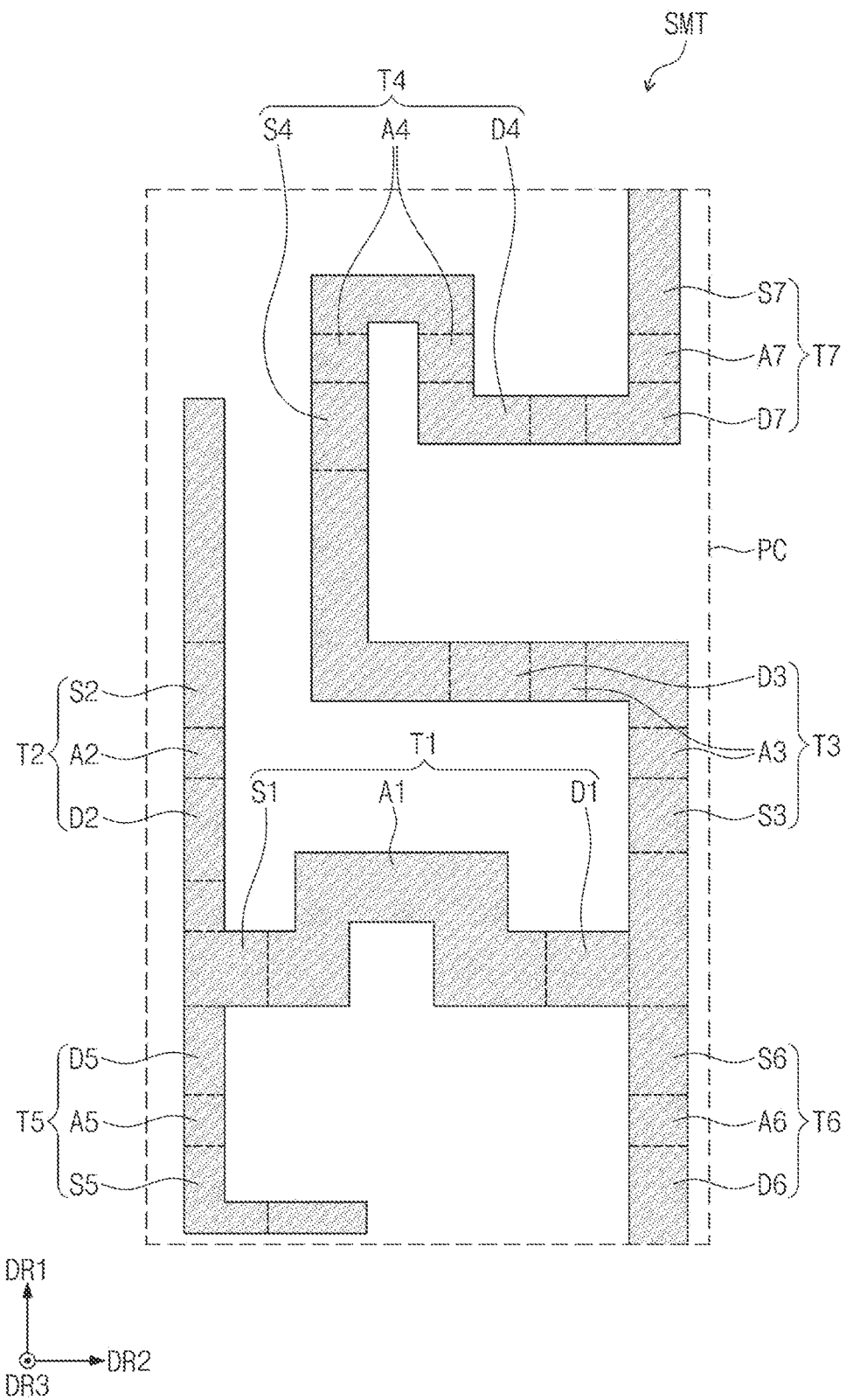
FIGS. 13A to 13E are plan views of a structure of the pixel circuit shown in FIG. 7 according to some embodiments of the present disclosure.

Referring to FIG. 13A, a semiconductor pattern SMT shown in FIG. 13A may be located on the substrate SUB shown in FIG. 11. The semiconductor pattern SMT may have a substantially S shape.

First, second, third, fourth, fifth, sixth, and seventh source areas S1, S2, S3, S4, S5, S6, and S7, first, second, third, fourth, fifth, sixth, and seventh drain areas D1, D2, D3, D4, D5, D6, and D7, and first, second, third, fourth, fifth, sixth, and seventh channel areas A1, A2, A3, A4, A5, A6, and A7 of the first, second, third, fourth, fifth, sixth, and seventh transistors T1, T2, T3, T4, T5, T6, and T7 may be formed by the semiconductor pattern SMT. Each of the first to seventh channel areas A1 to A7 may be defined between a corresponding source area of the first to seventh source areas S1 to S7 and a corresponding drain area of the first to seventh drain areas D1 to D7.

The first source area S1, the first channel area A1, and the first drain area D1 of the first transistor T1 may be arranged in the second direction DR2. The second drain area D2 of the second transistor T2 and the fifth drain area D5 of the fifth transistor T5 may extend from the first source area S1 of the first transistor T1. The sixth source area S6 of the sixth transistor T6 and the third source area S3 of the third transistor T3 may extend from the first drain area D1 of the first transistor T1.

The fourth source area S4 of the fourth transistor T4 may extend from the third drain area D3 of the third transistor T3. The seventh drain area D7 of the seventh transistor T7 may extend from the fourth drain area D4 of the fourth transistor T4.

Figure 13B:
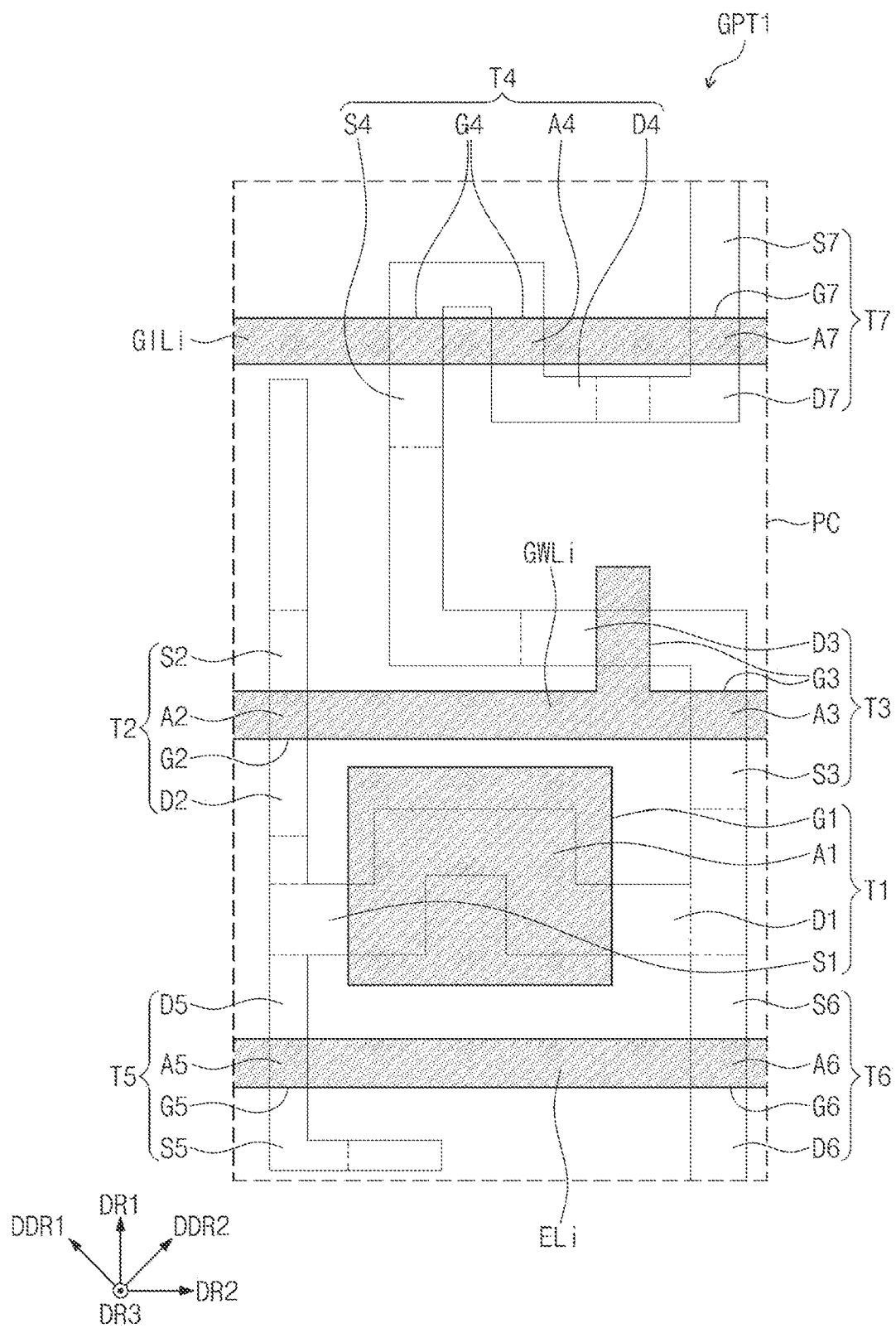

Referring to FIG. 13B, a first gate pattern GPT1 may be located on the semiconductor pattern SMT. The first gate pattern GPT1 may include an i-th initialization scan line GILi, an i-th write scan line GWLi, a first gate electrode G1, and an i-th emission line ELi. The i-th initialization scan line GILi, the i-th write scan line GWLi, and the i-th emission line ELi may extend in the second direction DR2 and may be arranged in the first direction DR1.

The i-th initialization scan line GILi may receive the i-th initialization scan signal Gli described above. The i-th write scan line GWLi may receive the i-th write scan signal GWi described above. The i-th emission line ELi may receive the i-th emission signal ESi described above.

The first gate electrode G1 may be located between the i-th emission line ELi and the i-th write scan line GWLi. The i-th write scan line GWLi may be located between the first gate electrode G1 and the i-th initialization scan line GILi.

The first gate electrode G1 of the first transistor T1 may be formed by the first gate pattern GPT1. The first gate electrode G1 may be arranged to overlap the first channel area A1.

The i-th emission line ELi may extend to cross the semiconductor pattern SMT. A fifth gate electrode G5 of the fifth transistor T5 and a sixth gate electrode G6 of the sixth transistor T6 may be formed by the i-th emission line ELi.

When viewed in the plane, portions of the i-th emission line ELi, which overlap the semiconductor pattern SMT, may be defined as the fifth and sixth gate electrodes G5 and G6. When viewed in the plane, the fifth gate electrode G5 may overlap the fifth channel area A5, and the sixth gate electrode G6 may overlap the sixth channel area A6.

The i-th write scan line GWLi may extend to cross the semiconductor pattern SMT. A second gate electrode G2 of the second transistor T2 and a third gate electrode G3 of the third transistor T3 may be formed by the i-th write scan line GWLi.

When viewed in the plane, portions of the i-th write scan line GWLi, which overlap the semiconductor pattern SMT, may be defined as the second and third gate electrodes G2 and G3. When viewed in the plane, the second gate electrode G2 may overlap the second channel area A2, and the third gate electrode G3 may overlap the third channel area A3.

The i-th initialization scan line GILi may extend to cross the semiconductor pattern SMT. A fourth gate electrode G4 of the fourth transistor T4 and a seventh gate electrode G7 of the seventh transistor T7 may be formed by the i-th initialization scan line GILi.

When viewed in the plane, portions of the i-th initialization scan line GILi, which overlap the semiconductor pattern SMT, may be defined as the fourth and seventh gate electrodes G4 and G7. When viewed in the plane, the fourth gate electrode G4 may overlap the fourth channel area A4, and the seventh gate electrode G7 may overlap the seventh channel area A7.

The second transistor T2 and the sixth transistor T6 may be arranged with the first transistor T1 interposed therebetween and may be arranged in a first diagonal direction DDR1 with respect to the first transistor T1. The third transistor T3 and the fifth transistor T5 may be arranged with the first transistor T1 interposed therebetween and may be arranged in a second diagonal direction DDR2 with respect to the first transistor T1.

The first diagonal direction DDR1 may cross the first and second directions DR1 and DR2 on the plane defined by the first and second directions DR1 and DR2. The second diagonal direction DDR2 may cross the first diagonal direction DDR1.

The fourth and seventh transistors T4 and T7 may be arranged in the second direction DR2, and the second and third transistors T2 and T3 may be spaced apart from the fourth and seventh transistors T4 and T7 in the first direction DR1 and may be arranged in the second direction DR2. The fifth and sixth transistors T5 and T6 may be spaced apart from the second and third transistors T2 and T3 in the first direction DR1 and may be arranged in the second direction DR2. The second and third transistors T2 and T3 may be located between the fourth and seventh transistors T4 and T7 and the fifth and sixth transistors T5 and T6.

Hereinafter, the reference numerals of the source areas S1 to S7, the drain areas D1 to D7, and the channel areas A1 to A7 will be omitted in FIGS. 13C to 13E to briefly show the configurations, and the reference numerals of the transistors T1 to T7 will be illustrated. Descriptions of the source areas S1 to S7, the drain areas D1 to D7, the channel areas A1 to A7, and the gate electrodes G1 to G7 will be made with reference to FIG. 13B.

Figure 13C:
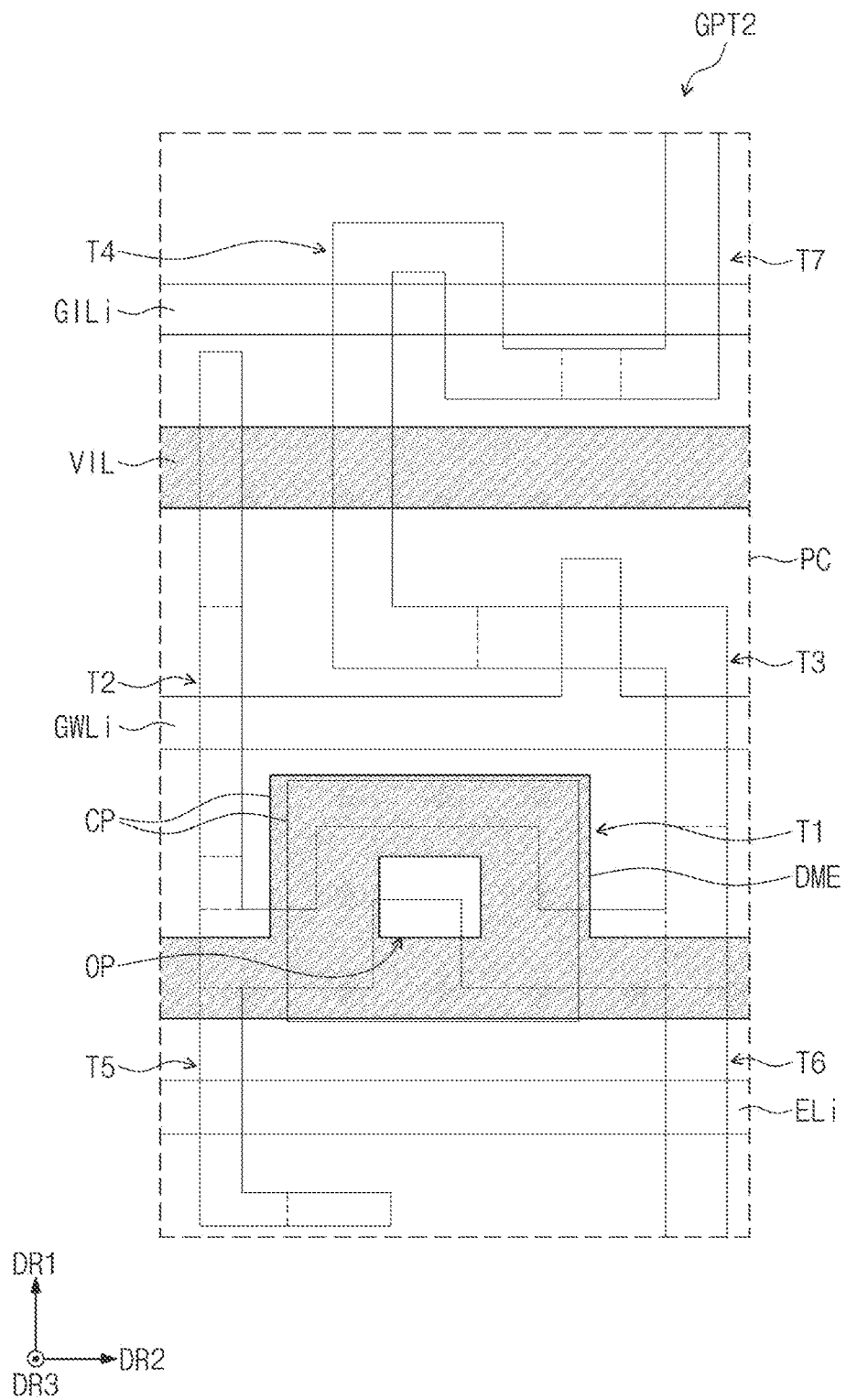

Referring to FIGS. 13B and 13C, a second gate pattern GPT2 may be located on the first gate pattern GPT1. The second gate pattern GPT2 may include the dummy electrode DME and an initialization line VIL. The dummy electrode DME may be the dummy electrode DME shown in FIG. 11. The dummy electrode DME and the initialization line VIL may be located on the same layer. The dummy electrode DME and the initialization line VIL may be substantially simultaneously formed by patterning the same material.

When viewed in the plane, the dummy electrode DME may partially overlap the first gate electrode G1. An opening OP may be defined through the dummy electrode DME. The capacitor CP described above may be formed by the dummy electrode DME and the first gate electrode G1, which overlap each other.

The initialization line VIL may be spaced apart from the dummy electrode DME in the first direction DR1 and may extend in the second direction DR2. The initialization line VIL may be adjacent to the fourth and seventh transistors T4 and T7. The initialization line VIL may receive the initialization voltage Vint described above.

Figure 13D:
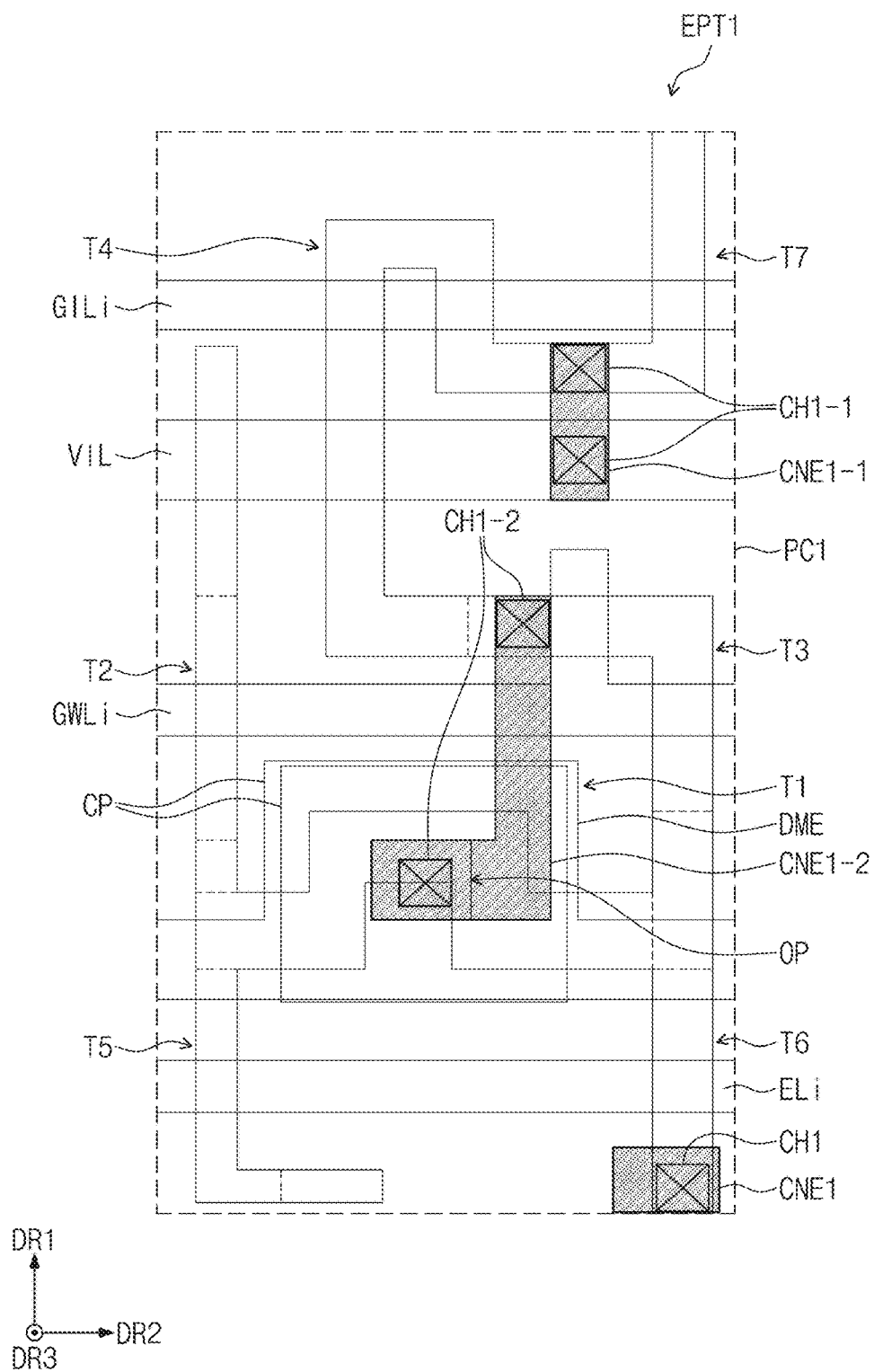

Referring to FIGS. 13B and 13D, a first electrode pattern EPT1 may be located on the second gate pattern GPT2. The first electrode pattern EPT1 may include the first connection electrode CNE1, a first-first connection electrode CNE1-1, and a first-second connection electrode CNE1-2.

The first connection electrode CNE1 may be the first connection electrode CNE1 shown in FIG. 11. The first connection electrode CNE1, the first-first connection electrode CNE1-1, and the first-second connection electrode CNE1-2 may be located on the same layer. The first connection electrode CNE1, the first-first connection electrode CNE1-1, and the first-second connection electrode CNE1-2 may be substantially simultaneously formed by patterning the same material.

The first connection electrode CNE1 may be connected to the sixth transistor T6. As an example, the first connection electrode CNE1 may be connected to the sixth drain area D6 via the first contact hole CH1. The first contact hole CH1 may be the first contact hole CH1 shown in FIG. 11.

The first-first connection electrode CNE1-1 may connect the initialization line VIL to the fourth and seventh transistors T4 and T7. As an example, the first-first connection electrode CNE1-1 may be connected to the initialization line VIL and the fourth and seventh drain areas D4 and D7 via first-first contact holes CH1-1. The first-first contact holes CH1-1 may be formed by substantially the same process as the first contact hole CH1.

The first-second connection electrode CNE1-2 may connect the first transistor T1 to the third transistor T3. As an example, the first-second connection electrode CNE1-2 may be connected to the first gate electrode G1 and the third drain area D3 via first-second contact holes CH1-2. The first-second connection electrode CNE1-2 may be connected to the first gate electrode G1 via the first-second contact hole CH1-2, which overlaps the opening OP, among the first-second contact holes CH1-2. The first-second contact holes CH1-2 may be formed by substantially the same process as the first contact hole CH1.

Figure 13E:
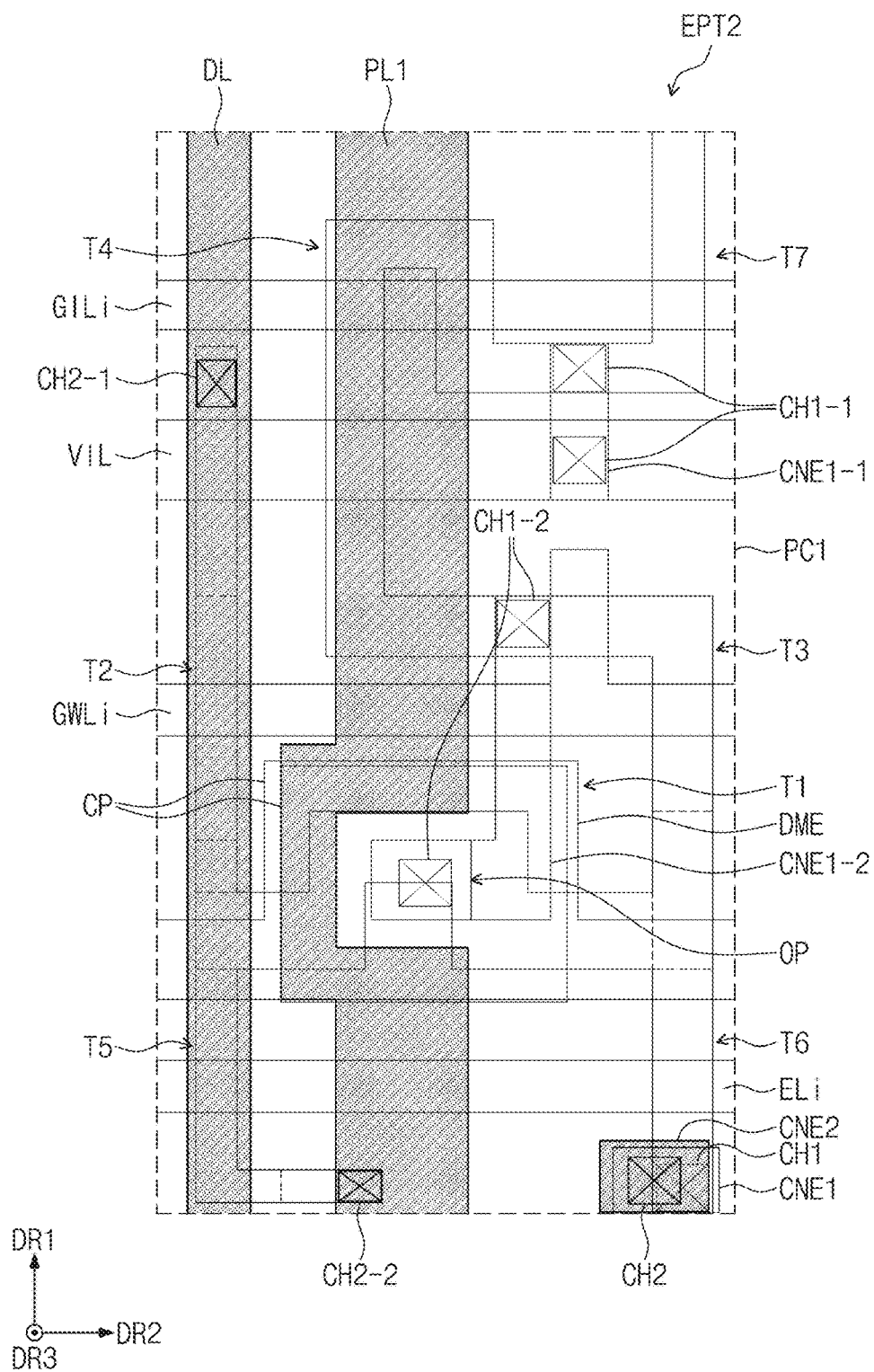

Referring to FIGS. 13B and 13E, a second electrode pattern EPT2 may be located on the first electrode pattern EPT1. The second electrode pattern EPT2 may include the second connection electrode CNE2, the data line DL, and the first power line PL1.

The second connection electrode CNE2 may be the second connection electrode CNE2 shown in FIG. 11. The second connection electrode CNE2, the data line DL, and the first power line PL1 may be located on the same layer. The second connection electrode CNE2, the data line DL, and the first power line PL1 may be substantially simultaneously formed by patterning the same material.

The second connection electrode CNE2 may be connected to the first connection electrode CNE1. As an example, the second connection electrode CNE2 may be connected to the first connection electrode CNE1 via the second contact hole CH2. The second contact hole CH2 may be the second contact hole CH2 shown in FIG. 11. According to some embodiments, the second connection electrode CNE2 may be connected to the first electrode AE of the light emitting element LE1 shown in FIG. 11.

The data line DL may be connected to the second transistor T2. As an example, the data line DL may be connected to the second source area S2 of the second transistor T2 via a second-first contact hole CH2-1. The second-first contact hole CH2-1 may be formed by substantially the same process as the second contact hole CH2.

The first power line PL1 may be connected to the fifth transistor T5. As an example, the first power line PL1 may be connected to the fifth source area S5 of the fifth transistor T5 via a second-second contact hole CH2-2. The second-second contact hole CH2-2 may be formed by substantially the same process as the second contact hole CH2.

The first to seventh transistors T1 to T7 may be distributed and arranged in the above-described positions in the pixel circuit PC having the width greater than the dummy pixel circuit DPC in the second direction DR2.

FIGS. 14A to 14D and 14F are plan views of a structure of the dummy pixel circuit shown in FIG. 10. FIG. 14E is a cross-sectional view taken along a line I-I' shown in FIG. 14D.

As an example, in FIGS. 14A to 14D and 14F, two first pixel circuits PC1 adjacent to the dummy circuit area DCA and corresponding to the dummy pixel circuit DPC are illustrated by a dotted line.

Figure 14A:
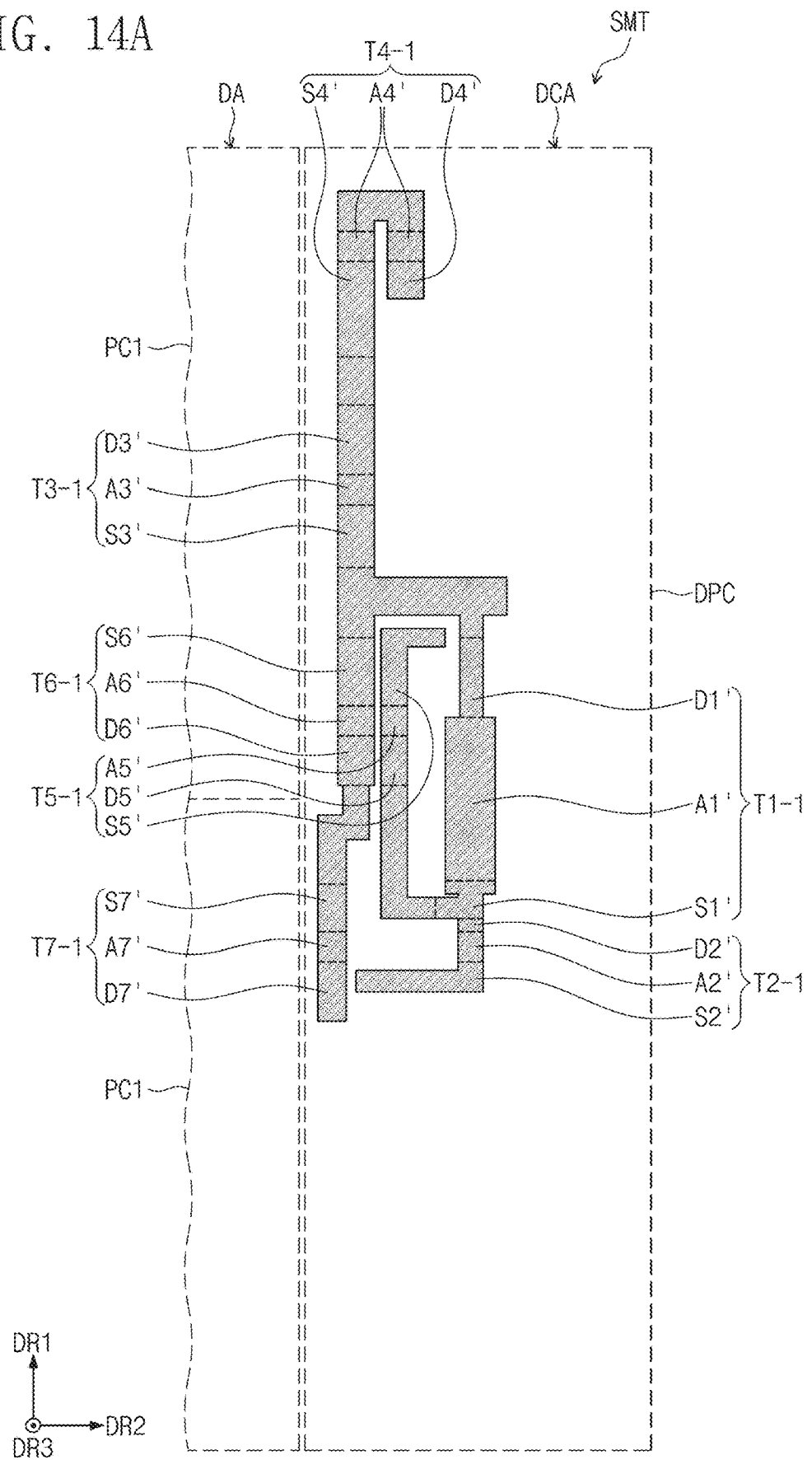
FIGS. 14A to 14D and 14F are plan views of a structure of the dummy pixel circuit shown in FIG. 10 according to some embodiments of the present disclosure.

Referring to FIG. 14A, a semiconductor pattern SMT shown in FIG. 14A may be located on the substrate SUB shown in FIG. 12. Hereinafter, the term "width" may indicate a value measured in the second direction DR2, and the term "length" may indicate a value measured in the first direction DR1.

The semiconductor pattern SMT shown in FIG. 14A may have a width smaller than a width of the semiconductor pattern SMT shown in FIG. 13A. In addition, the semiconductor pattern SMT shown in FIG. 14A may have a length greater than a length of the semiconductor pattern SMT shown in FIG. 13A. Accordingly, the dummy pixel circuit DPC may have a width smaller than that of the first pixel circuit PC1 in the second direction DR2 and may have a length greater than that of the first pixel circuit PC1 in the first direction DR1.

First, second, third, fourth, fifth, sixth, and seventh source areas S1', S2', S3', S4', S5', S5', and S7', first, second, third, fourth, fifth, sixth, and seventh drain areas D1', D2', D3', D4', D5', D6', and D7', and first, second, third, fourth, fifth, sixth, and seventh channel areas A1', A2', A3', A4', A5', A6', and A7' of the first-first, second-first, third-first, fourth-first, fifth-first, sixth-first, and seventh-first transistors T1-1, T2-1, T3-1, T4-1, T5-1, T6-1, and T7-1 may be formed by the semiconductor pattern SMT. Each of the first to seventh channel areas A1' to A7' may be located between a corresponding source area of the first to seventh source areas S1' to S7' and a corresponding drain area of the first to seventh drain areas D1' to D7'.

Different from the first transistor T1, the first source area S1', the first channel area A1', and the first drain area D1' of the first-first transistor T1-1 may be arranged in the first direction DR1. The second drain area D2' of the second-first transistor T2-1 and the fifth drain area D5' of the fifth-first transistor T5-1 may extend from the first source area S1' of the first-first transistor T1-1.

The sixth source area S6' of the sixth-first transistor T6-1 and the third source area S3' of the third-first transistor T3-1 may extend from the first drain area D1' of the first-first transistor T1-1. The fourth source area S4' of the fourth-first transistor may extend from the third drain area D3' of the third-first transistor T3-1. The seventh source area S7' of the seventh-first transistor T7-1 may extend from the sixth drain area D6' of the sixth-first transistor T6-1.

Figure 14B:
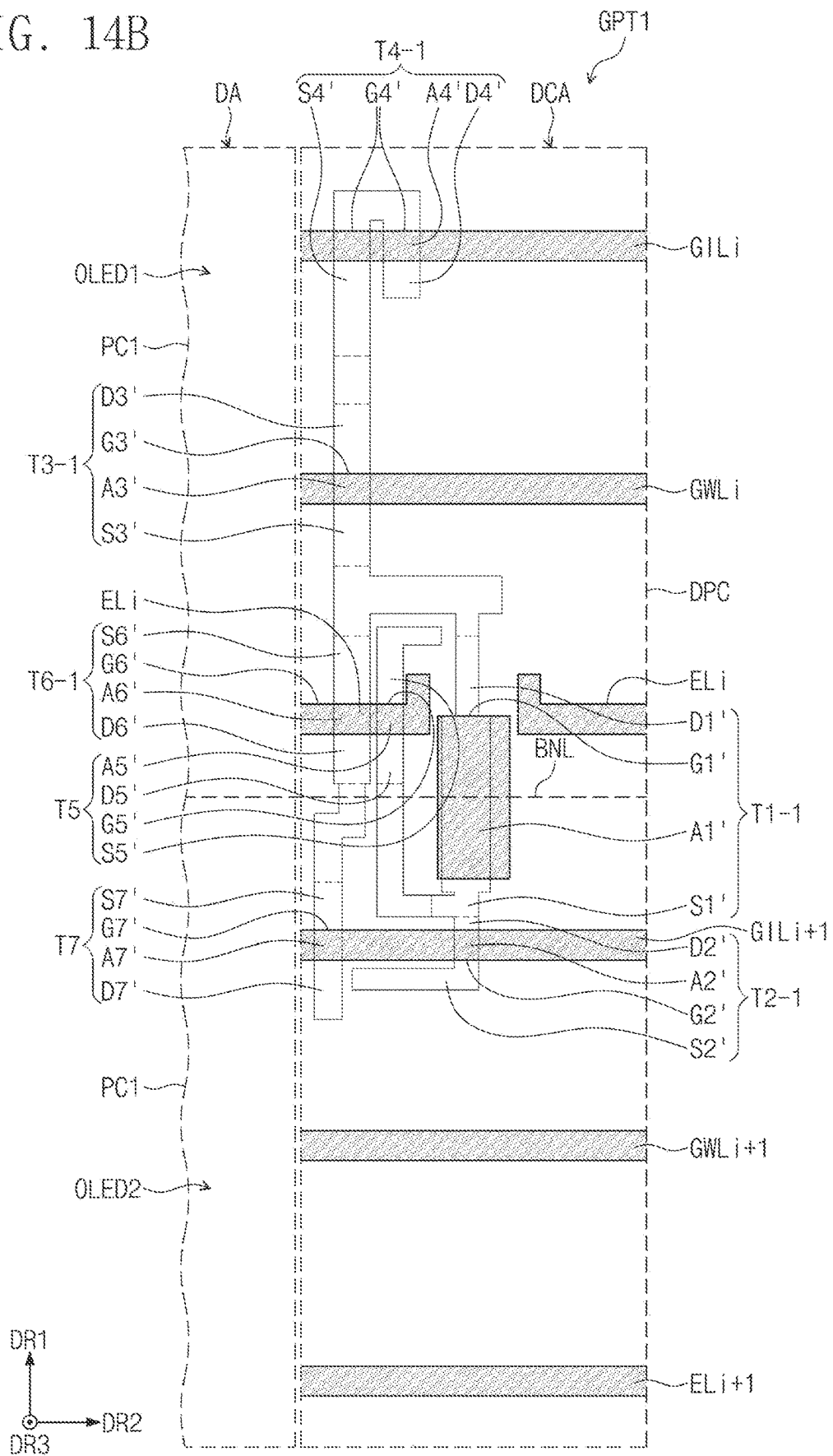

Referring to FIG. 14B, a first gate pattern GPT1 may be located on the semiconductor pattern SMT. The first gate pattern GPT1 may include a first gate electrode G1', the i-th initialization scan line GILi, the i-th write scan line GWLi, the i-th emission line ELi, an (i+1)th initialization scan line GILi+1, an (i+1)th write scan line GWLi+1, and an (i+1)th emission line ELi+1.

The i-th initialization scan line GILi, the i-th write scan line GWLi, the (i+1)th initialization scan line GILi+1, the (i+1)th write scan line GWLi+1, and the (i+1)th emission line ELi+1 may extend in the second direction DR2 and may be arranged in the first direction DR1. The i-th emission line ELi may extend in the second direction DR2 and may be divided into plural portions with the first-first transistor T1-1 interposed therebetween.

In a case where the i-th emission line ELi extends to cross a semiconductor layer of the first-first transistor T1-1, an additional transistor may be formed. According to some embodiments, the i-th emission line ELi may be divided into plural portions such that the i-th emission line ELi may not extend to cross the first-first transistor T1-1. Accordingly, the i-th emission line ELi may not overlap the first-first transistor T1-1.

The first gate electrode G1' and the i-th emission line ELi may be located between the i-th write scan line GWLi and the (i+1)th initialization scan line GILi+1. The i-th write scan line GWLi may be located between the i-th initialization scan line GILi and the i-th emission line ELi.

The (i+1)th initialization scan line GILi+1 may be located between the i-th emission line ELi and the (i+1)th write scan line GWLi+1. The (i+1)th write scan line GWLi+1 may be located between the (i+1)th initialization scan line GILi+1 and the (i+1)th emission line ELi+1.

The i-th initialization scan line GILi, the i-th write scan line GWLi, and the i-th emission line ELi may extend toward one first pixel circuit PC1 located at a relatively high position among two first pixel circuits PC1 arranged at a left side and may be connected to the one first pixel circuit PC1 located at the relatively high position among the two first pixel circuits PC1.

The (i+1)th initialization scan line GILi+1, the (i+1)th write scan line GWLi+1, and the (i+1)th emission line ELi+1 may extend toward the other first pixel circuit PC1 located at a relatively low position among the two first pixel circuits PC1 arranged at the left side and may be connected to the other first pixel circuit PC1 located at the relatively low position among the two first pixel circuits PC1.

According to some embodiments, the (i+1)th initialization scan line GILi+1, the (i+1)th write scan line GWLi+1, and the (i+1)th emission line ELi+1 may receive an (i+1)th initialization scan signal, an (i+1)th write scan signal, and an (i+1)th emission signal, respectively.

The first gate electrode G1' of the first-first transistor T1-1 may be formed by the first gate pattern GPT1. The first gate electrode G1' may be arranged to overlap the first channel area A1'.

The i-th emission line ELi may extend to cross the semiconductor pattern SMT. A fifth gate electrode G5' of the fifth-first transistor T5-1 and a sixth gate electrode G6' of the sixth-first transistor T6-1 may be formed by the i-th emission line ELL When viewed in the plane, portions of the i-th emission line ELi, which overlap the semiconductor pattern SMT, may be defined as the fifth and sixth gate electrodes G5' and G6'. When viewed in the plane, the fifth gate electrode G5' may overlap the fifth channel area A5', and the sixth gate electrode G6' may overlap the sixth channel area A6'.

The i-th write scan line GWLi may extend to cross the semiconductor pattern SMT. A third gate electrode G3' of the third-first transistor T3-1 may be formed by the i-th write scan line GWLi.

When viewed in the plane, a portion of the i-th write scan line GWLi, which overlaps the semiconductor pattern SMT, may be defined as the third gate electrode G3'. When viewed in the plane, the third gate electrode G3' may overlap the third channel area A3'.

The i-th initialization scan line GILi may extend to cross the semiconductor pattern SMT. A fourth gate electrode G4' of the fourth-first transistor T4-1 may be formed by the i-th initialization scan line GILL When viewed in the plane, a portion of the i-th initialization scan line GILi, which overlaps the semiconductor pattern SMT, may be defined as the fourth gate electrode G4'. When viewed in the plane, the fourth gate electrode G4' may overlap the fourth channel area A4'.

The (i+1)th initialization scan line GILi+1 may extend to cross the semiconductor pattern SMT. A second gate electrode G2' of the second-first transistor T2-1 and a seventh gate electrode G7' of the seventh-first transistor T7-1 may be formed by the (i+1)th initialization scan line GILi+1.

When viewed in the plane, portions of the (i+1)th initialization scan line GILi+1, which overlap the semiconductor pattern SMT, may be defined as the second and seventh gate electrodes G2' and G7'. When viewed in the plane, the second gate electrode G2' may overlap the second channel area A2', and the seventh gate electrode G7' may overlap the seventh channel area A7'.

In FIG. 10, the second-first transistor T2-1 may receive the i-th write scan signal GWi, and the seventh-first transistor T7-1 may receive the (i+1)th initialization scan signal Gli+1. However, the i-th write scan signal GWi and the (41)th initialization scan signal Gli+1 may be substantially the same signal as each other. Accordingly, the second-first transistor T2-1 may receive the (i+1)th initialization scan signal Gli+1, which is the same as the i-th write scan signal GWi, via the (i+1)th initialization scan line GILi+1 and may be normally operated.

The first source area S1, the first channel area A1, and the first drain area D1 shown in FIG. 13B are arranged in the second direction DR2, however, the first source area S1', the first channel area A1', and the first drain area D1' shown in FIG. 14B may be arranged in the first direction DR1. Accordingly, the first-first transistor T1-1 may have a width smaller than that of the first transistor T1 in the second direction DR2 and may have a length longer than that of the first transistor T1 in the first direction DR1. According to the structure described above, a width of the dummy pixel circuit DPC may be reduced.

The first-first transistor T1-1 may be arranged to overlap a portion of the dummy pixel circuit DPC corresponding to a boundary between the first pixel circuits PC1. As an example, the first-first transistor T1-1 may overlap a boundary line BNL extending in the dummy pixel circuit DPC at the boundary between the first pixel circuits PC1.

The first-first transistor T1-1 and the second-first transistor T2-1 may be arranged in the first direction DR1. The fifth-first and sixth-first transistors T5-1 and T6-1 may be arranged adjacent to each other in the second direction DR2.

The fourth-first transistor T4-1, the third-first transistor T3-1, the fifth-first and sixth-first transistors T5-1 and T6-1, and the seventh-first transistor T7-1 may be arranged in the first direction DR1. According to the structure described above, the number of the transistors arranged along the first direction DR1 in dummy pixel circuit DPC may be greater than the number of the transistors arranged along the first direction DR1 in the pixel circuit PC shown in FIG. 13B.

The fourth-first transistor T4-1, the third-first transistor T3-1, the fifth-first and sixth-first transistors T5-1 and T6-1, and the seventh-first transistor T7-1 may be located between the first-first transistor T1-1 and the display area DA.

The third-first, fourth-first, fifth-first, and sixth-first transistors T3-1, T4-1, T5-1, and T6-1 may be arranged in an area of the dummy pixel circuit DPC adjacent to the first pixel circuit PC1 located under the first light emitting element LE1. The second-first and seventh-first transistors T2-1 and T7-1 may be arranged in an area of the dummy pixel circuit DPC adjacent to the first pixel circuit PC1 located under the third light emitting element LE3.

When comparing FIG. 13B with FIG. 14B, the transistors T1-1 to T7-1 may be arranged while being distributed longer in the first direction DR1 in the dummy pixel circuit DPC. In addition, the first-first transistor T1-1 may be formed to have a relatively long length in the first direction DR1. As a result, the width in the second direction DR2 of the dummy pixel circuit DPC may be smaller than the width in the second direction DR2 of the pixel circuit PC.

Hereinafter, the reference numerals of the source areas S1' to S7', the drain areas D1' to D7', the channel areas A1' to A7', and the gate electrodes G1' to G7' will be omitted in FIGS. 14C, 14D, and 14F to briefly show the configurations, and the reference numerals of the transistors T1-1 to T7-1 will be illustrated. Descriptions of the source areas S1' to S7', the drain areas D1' to D7', the channel areas A1' to A7', and the gate electrodes G1' to G7' will be made with reference to FIG. 14B.

Figure 14C:
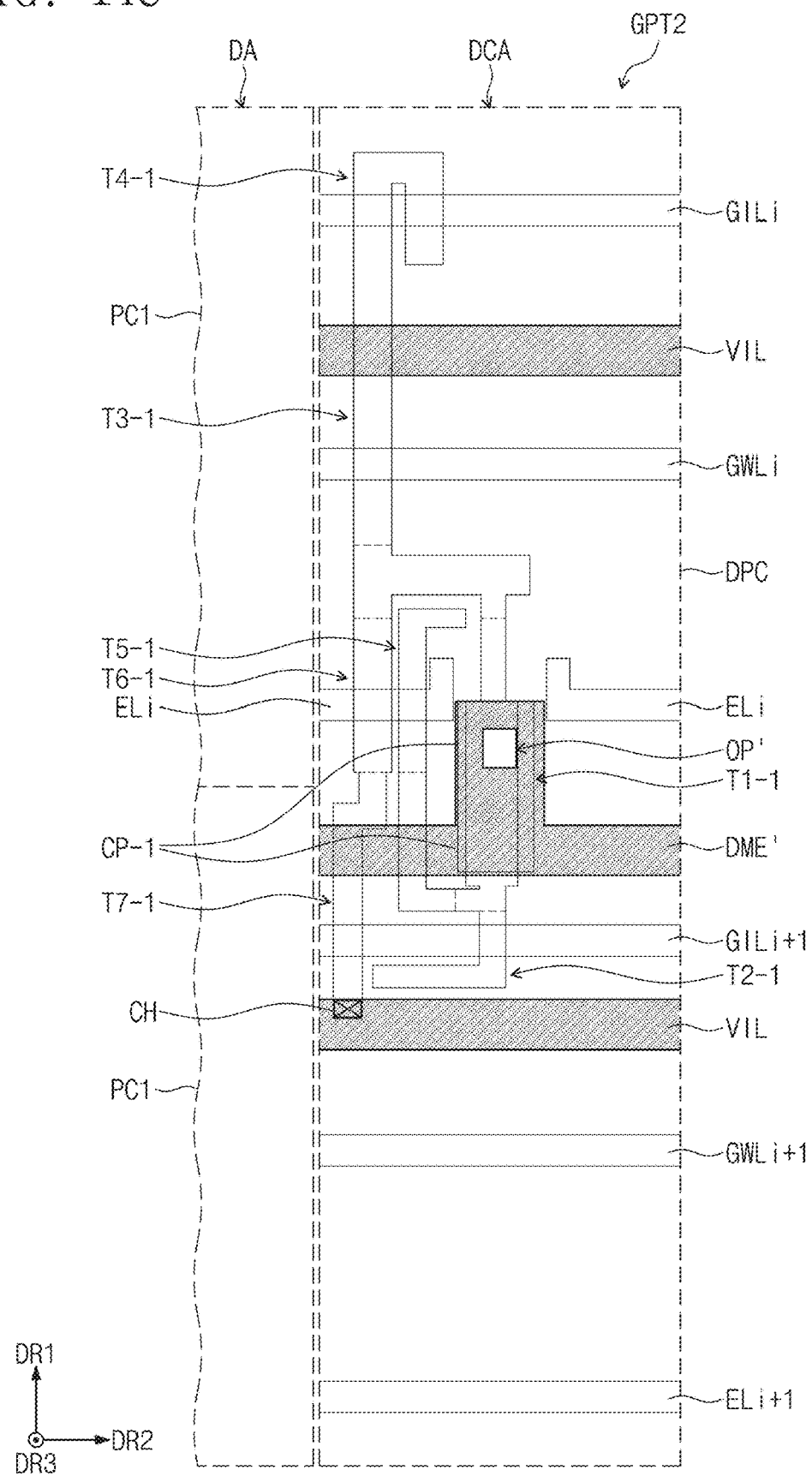

Referring to FIGS. 14B and 14C, a second gate pattern GPT2 may be located on the first gate pattern GPT1. The second gate pattern GPT2 may include a dummy electrode DME' and the initialization lines VIL. The dummy electrode DME' may be the dummy electrode DME' shown in FIG. 12. The dummy electrode DME' and the initialization lines VIL may be located on the same layer. The dummy electrode DME' and the initialization lines VIL may be substantially simultaneously formed by patterning the same material.

When viewed in the plane, the dummy electrode DME' may partially overlap the first gate electrode G1'. The dummy electrode DME' may be provided with an opening OP defined therethrough. The capacitor CP-1 described above may be formed by the dummy electrode DME' and the first gate electrode G1', which overlap each other.

The initialization lines VIL may extend in the second direction DR2. The dummy electrode DME' may be located between the initialization lines VIL. One of the initialization lines VIL may be adjacent to the fourth-first transistor T4-1, and the other of the initialization lines VIL may be adjacent to the seventh-first transistor T7-1.

The initialization line VIL adjacent to the seventh-first transistor T7-1 may be connected to the seventh-first transistor T7-1. The initialization line VIL may be connected to the seventh drain area D7' of the seventh-first transistor 7-1 via a contact hole CH. The initialization line VIL may be located on the second insulating layer INS2 as the dummy electrode DME' shown in FIG. 12. According to some embodiments, the contact hole CH may be defined through the first and second insulating layers INS1 and INS2 shown in FIG. 12.

Figure 14D:
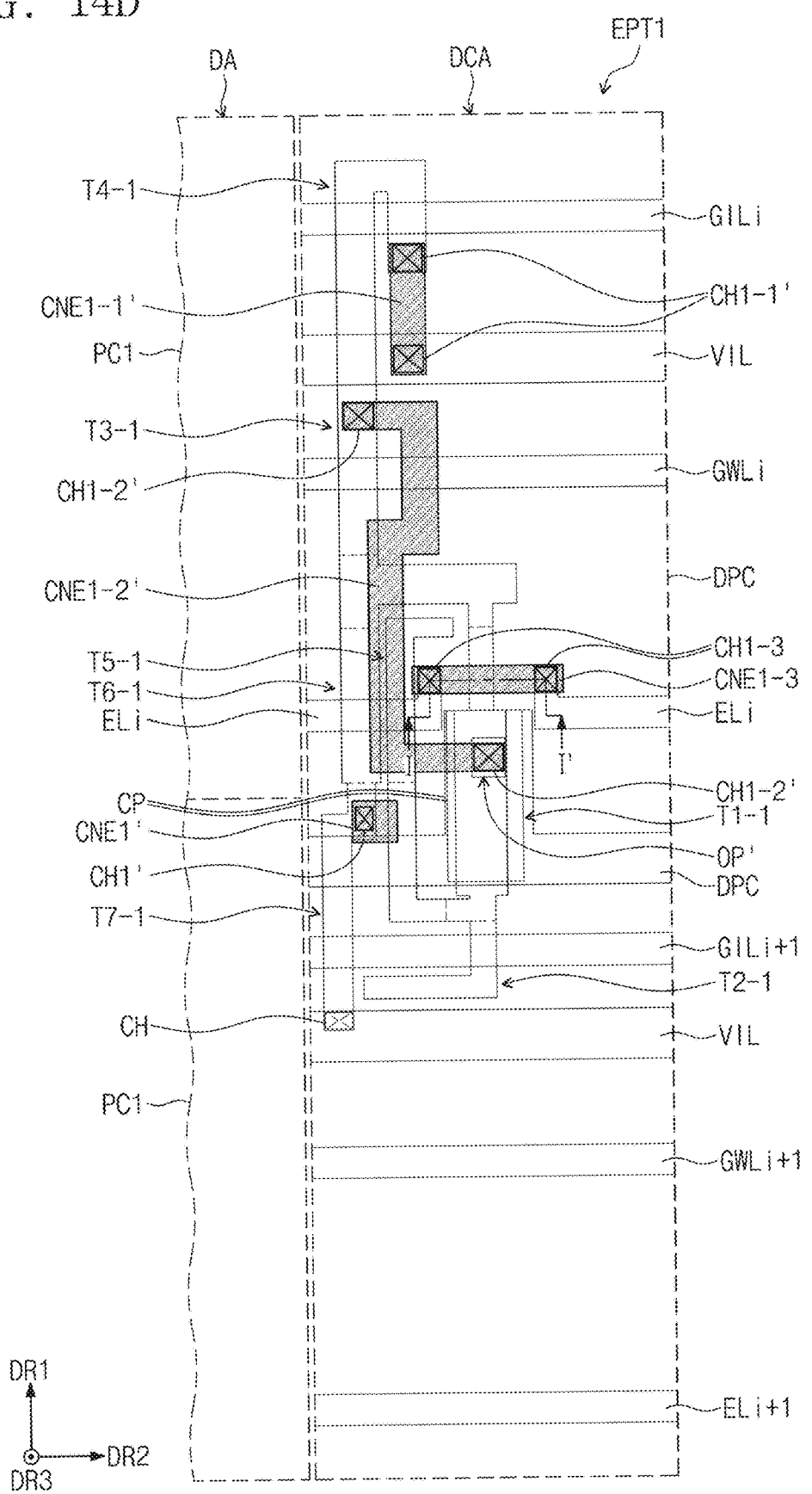
Figure 14E:
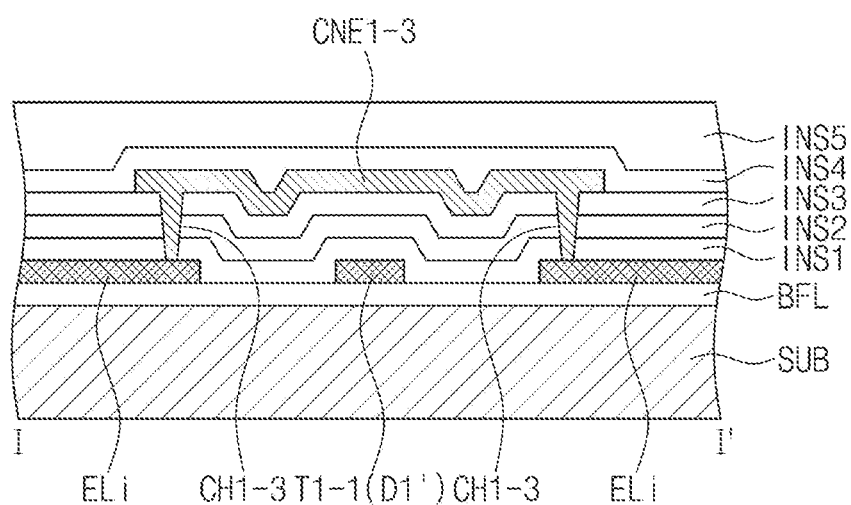
FIG. 14E is a cross-sectional view taken along a line I-I' shown in FIG. 14D according to some embodiments of the present disclosure.

Referring to FIGS. 14B and 14D, a first electrode pattern EPT1 may be located on the second gate pattern GPT2. The first electrode pattern EPT1 may include the first connection electrode CNE1', a first-first connection electrode CNE1-1', a first-second connection electrode CNE1-2', and a first-third connection electrode CNE1-3.

The first connection electrode CNE1' may be the first connection electrode CNE1' shown in FIG. 12. The first connection electrode CNE1', the first-first connection electrode CNE1-1', the first-second connection electrode CNE1-2', and the first-third connection electrode CNE1-3 may be located on the same layer. The first connection electrode CNE1', the first-first connection electrode CNE1-1', the first-second connection electrode CNE1-2', and the first-third connection electrode CNE1-3 may be substantially simultaneously formed by patterning the same material.

The first connection electrode CNE1' may be connected to the sixth-first transistor T6-1. As an example, the first connection electrode CNE1' may be connected to the sixth drain area D6' via a first contact hole CH1'. The first contact hole CH1' may be the first contact hole CH1' shown in FIG. 12.

The first-first connection electrode CNE1-1' may connect the initialization line VIL adjacent to the fourth-first transistor T4-1 to the fourth-first transistor T4-1. As an example, the first-first connection electrode CNE1-1' may be connected to the initialization line VIL adjacent to the fourth-first transistor T4-1 and the fourth drain area D4' via first-first contact holes CH1-1'. The first-first contact holes CH1-1' may be formed by substantially the same process as the first contact hole CH1'.

The first-second connection electrode CNE1-2' may connect the first-first transistor T1-1 to the third-first transistor T3-1. As an example, the first-second connection electrode CNE1-2' may be connected to the first gate electrode G1' and the third drain area D3' via a first-second contact holes CH1-2'. The first-second connection electrode CNE1-2' may be connected to the first gate electrode G1' via the first-second contact hole CH1-2', which overlaps the opening OP', among the first-second contact holes CH1-2'. The first-second contact holes CH1-2' may be formed by substantially the same process as the first contact hole CH1'.

Referring to FIGS. 14D and 14E, the i-th emission lines ELi divided into plural portions may be connected to each other by the first-third connection electrode CNE1-3 located on the first-first transistor T1-1. The first-third connection electrode CNE1-3 may be located on the third insulating layer INS3. The first-third connection electrode CNE1-3 may be connected to the divided i-th emission lines ELi via first-third contact holes CH1-3 defined through the first to third insulating layers INS1 to INS3. The first-third contact holes CH1-3 may be formed by substantially the same process as the first contact hole CH1'.

Figure 14F:
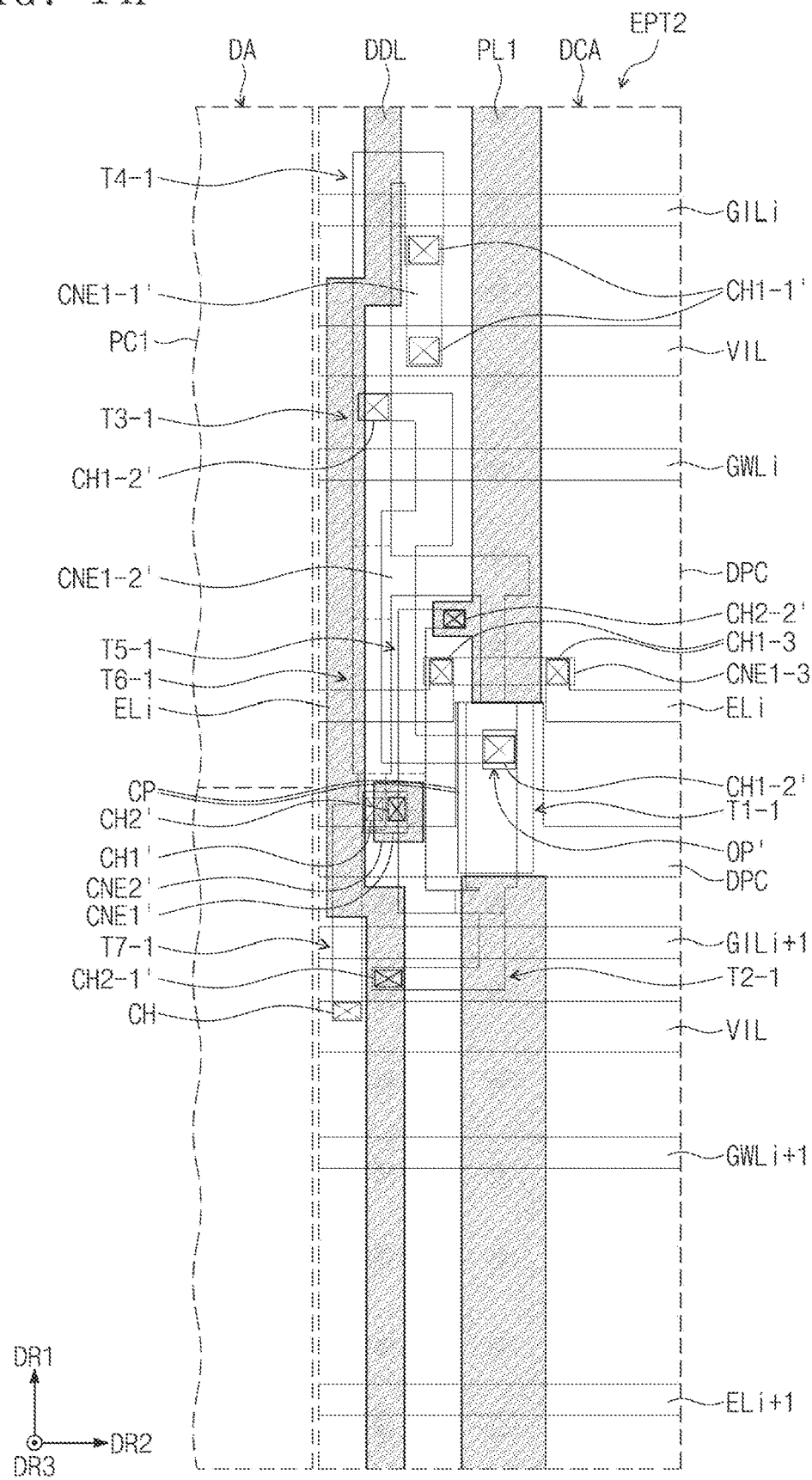

Referring to FIGS. 14B and 14F, a second electrode pattern EPT2 may be located on the first electrode pattern EPT1. The second electrode pattern EPT2 may include the second connection electrode CNE2', the dummy data line DDL, and the first power line PL1.

The second connection electrode CNE2' may be the second connection electrode CNE2' shown in FIG. 12. The second connection electrode CNE2', the dummy data line DDL, and the first power line PL1 may be located on the same layer and may be substantially simultaneously formed by patterning the same material.

The second connection electrode CNE2' may be connected to the first connection electrode CNE1'. As an example, the second connection electrode CNE2' may be connected to the first connection electrode CNE1' via a second contact hole CH2'. The second contact hole CH2' may be the second contact hole CH2' shown in FIG. 12. According to some embodiments, the second connection electrode CNE2' may be connected to the first electrode AE of the third light emitting element LE3 shown in FIG. 12.

The dummy data line DDL may be connected to the second-first transistor T2-1. As an example, the dummy data line DDL may be connected to the second source area S2' of the second-first transistor T2-1 via a second-first contact hole CH2-1'. The second-first contact hole CH2-1' may be formed by substantially the same process as the second contact hole CH2'.

The first power line PL1 may be connected to the fifth-first transistor T5-1. As an example, the first power line PL1 may be connected to the fifth source area S5' of the fifth transistor T5-1 via a second-second contact hole CH2-2'. The second-second contact hole CH2-2' may be formed by substantially the same process as the second contact hole CH2'.

As described above, the first-first to seventh-first transistors T1-1 to T7-1 may be arranged to be distributed longer along the first direction DR1 in the dummy pixel circuit DPC when compared with the transistors of the pixel circuit PC. Accordingly, the width in the first direction DR1 of the dummy pixel circuit DPC may be smaller than the width in the first direction DR1 of the pixel circuit PC, and thus, the dummy circuit area DCA may be reduced.

Although aspects of some embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims, and their equivalents.

What is claimed is:

1. A display device comprising:
   a first light emitting element;
   a third light emitting element adjacent to the first light emitting element in a first direction;
   second light emitting elements respectively adjacent to the first and third light emitting elements in a second direction crossing the first direction;
   first pixel circuits respectively under the first and third light emitting elements;
   second pixel circuits respectively under the second light emitting elements; and
   a dummy pixel circuit in a dummy circuit area adjacent to a display area in which the first, second, and third light emitting elements and the first and second pixel circuits are arranged and connected to the third light emitting element,
   wherein the dummy pixel circuit has a width smaller than a width of each of the first pixel circuits in the second direction.

2. The display device of claim 1, wherein the first light emitting element is connected to the first pixel circuit under the first light emitting element, and the second light emitting elements are between the first and third light emitting elements and the dummy pixel circuit and respectively connected to the second pixel circuits.

3. The display device of claim 2, further comprising a first light emitting element spaced apart from the third light emitting element in the second direction and connected to a first pixel circuit under the third light emitting element.

4. The display device of claim 1, wherein the dummy pixel circuit overlaps the first pixel circuits in a view from the second direction.

5. The display device of claim 1, wherein the dummy pixel circuit comprises:
   a first-first transistor comprising a first electrode connected to a power line, a second electrode connected to the third light emitting element, and a control electrode connected to a node; and
   a second-first transistor comprising a first electrode connected to a dummy data line, a second electrode connected to the first electrode of the first-first transistor, and a control electrode configured to receive an i-th write scan signal, and
   wherein a source area, a channel area, and a drain area of the first-first transistor are arranged in the first direction.

6. The display device of claim 5, wherein the first-first transistor overlaps a portion of the dummy pixel circuit, which corresponds to a boundary between the first pixel circuits.

7. The display device of claim 5, wherein the first-first transistor and the second-first transistor are arranged in the first direction.

8. The display device of claim 5, wherein the dummy pixel circuit further comprises:
   a fifth-first transistor comprising a first electrode connected to the power line, a second electrode connected to the first electrode of the first-first transistor, and a control electrode configured to receive an i-th emission signal; and
   a seventh-first transistor comprising a first electrode connected to the third light emitting element, a second electrode configured to receive an initialization voltage, and a control electrode configured to receive an (i+1)th initialization scan signal.

9. The display device of claim 8, wherein the dummy pixel circuit further comprises:
   a third-first transistor comprising a first electrode connected to the second electrode of the first-first transistor, a second electrode connected to the node, and a control electrode configured to receive the i-th write scan signal;
   a fourth-first transistor comprising a first electrode connected to the node, a second electrode configured to receive the initialization voltage, and a control electrode configured to receive an i-th initialization scan signal; and a sixth-first transistor comprising a first electrode connected to the second electrode of the first-first transistor, a second electrode connected to the third light emitting element, and a control electrode configured to receive the i-th emission signal.

10. The display device of claim 9, wherein the fifth-first and sixth-first transistors are adjacent to the first-first transistor, and the fourth-first transistor, the third-first transistor, the fifth-first and sixth-first transistors, and the seventh-first transistor are arranged in the first direction.

11. The display device of claim 10, wherein the fourth-first transistor, the third-first transistor, the fifth-first and sixth-first transistors, and the seventh-first transistor are between the first-first transistor and the display area.

12. The display device of claim 9, wherein the third-first, fourth-first, fifth-first, and sixth-first transistors are arranged in an area of the dummy pixel circuit adjacent to the first pixel circuit under the first light emitting element, and the second-first and seventh-first transistors are arranged in an area of the dummy pixel circuit adjacent to the first pixel circuit under the third light emitting element.

13. The display device of claim 8, wherein an i-th emission line forming control electrodes of the fifth-first transistor and a sixth-first transistor and configured to receive the i-th emission signal is divided into plural portions with the first-first transistor interposed therebetween.

14. The display device of claim 13, wherein the divided i-th emission lines are connected to each other by a connection electrode on the first-first transistor.

15. The display device of claim 1, wherein the first pixel circuit connected to the first light emitting element comprises:
a first transistor comprising a first electrode connected to a power line, a second electrode connected to the first light emitting element, and a control electrode connected to a node; and
a second transistor comprising a first electrode connected to a data line, a second electrode connected to the first electrode of the first transistor, and a control electrode configured to receive an i-th write scan signal, and a source area, a channel area, and a drain area of the first transistor are arranged in the second direction.

16. The display device of claim 15, wherein the first pixel circuit connected to the first light emitting element further comprises:
a fifth transistor comprising a first electrode connected to the power line, a second electrode connected to the first electrode of the first transistor, and a control electrode configured to receive an i-th emission signal; and
a seventh transistor comprising a first electrode connected to the first light emitting element, a second electrode configured to receive an initialization voltage, and a control electrode configured to receive an i-th initialization scan signal.

17. The display device of claim 16, wherein the first pixel circuit connected to the first light emitting element further comprises:
a third transistor comprising a first electrode connected to the second electrode of the first transistor, a second electrode connected to the node, and a control electrode configured to receive the i-th write scan signal;
a fourth transistor comprising a first electrode connected to the node, a second electrode configured to receive the initialization voltage, and a control electrode configured to receive the i-th initialization scan signal; and
a sixth transistor comprising a first electrode connected to the second electrode of the first transistor, a second electrode connected to the first light emitting element, and a control electrode configured to receive the i-th emission signal, the second and sixth transistors are arranged with the first transistor interposed therebetween in a first diagonal direction with respect to the first transistor, the third and fifth transistors are arranged with the first transistor interposed therebetween in a second diagonal direction with respect to the first transistor, the first diagonal direction is defined as a direction crossing the first and second directions on a plane defined by the first and second directions, and the second diagonal direction crosses the first diagonal direction.

18. The display device of claim 17, wherein the fourth and seventh transistors are arranged in the second direction, the second and third transistors are arranged in the second direction and spaced apart from the fourth and seventh transistors in the first direction, and the fifth and sixth transistors are arranged in the second direction and spaced apart from the second and third transistors in the first direction.

19. A display device comprising:
a first light emitting element;
a third light emitting element adjacent to the first light emitting element in a first direction;
second light emitting elements respectively adjacent to the first and third light emitting elements in a second direction crossing the first direction;
first pixel circuits respectively under the first and third light emitting elements;
second pixel circuits respectively under the second light emitting elements; and
a dummy pixel circuit in a dummy circuit area adjacent to a display area in which the first, second, and third light emitting elements and the first and second pixel circuits are arranged and connected to the third light emitting element, wherein the dummy pixel circuit has an area smaller than a sum of areas of the first pixel circuits.

20. A display device comprising:
a first light emitting element;
a third light emitting element adjacent to the first light emitting element in a first direction;
a second light emitting element adjacent to the first light emitting element in a second direction crossing the first direction;
a first pixel circuit under the first light emitting element and connected to the first light emitting element;
a second pixel circuit under the second light emitting element and connected to the second light emitting element; and
a dummy pixel circuit in a dummy circuit area adjacent to a display area in which the first, second, and third light emitting elements and the first and second pixel circuits are arranged and connected to the third light emitting element, wherein the first pixel circuit comprises a first transistor configured to drive the first light emitting element, the dummy pixel circuit comprises a first-first transistor configured to drive the third light emitting element, a source area, a channel area, and a drain area of the first transistor are arranged in the second direction, and a source area, a channel area, and a drain area of the first-first transistor are arranged in the first direction.

\* \* \* \* \*